(12) United States Patent
Tsai

(10) Patent No.: US 11,309,263 B2
(45) Date of Patent: Apr. 19, 2022

(54) SEMICONDUCTOR DEVICE STRUCTURE WITH AIR GAP STRUCTURE AND METHOD FOR PREPARING THE SAME

(71) Applicant: NANYA TECHNOLOGY CORPORATION, New Taipei (TW)

(72) Inventor: Tzu-Ching Tsai, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 61 days.

(21) Appl. No.: 16/871,923

(22) Filed: May 11, 2020

(65) Prior Publication Data

US 2021/0351140 A1 Nov. 11, 2021

(51) Int. Cl.
*G11C 5/02* (2006.01)
*H01L 23/64* (2006.01)
*G11C 5/06* (2006.01)
*H01L 23/48* (2006.01)

(52) U.S. Cl.
CPC .......... *H01L 23/642* (2013.01); *G11C 5/025* (2013.01); *G11C 5/06* (2013.01); *H01L 23/48* (2013.01)

(58) Field of Classification Search
CPC ......... G11C 5/025; G11C 5/06; H01L 23/642; H01L 23/48
See application file for complete search history.

(56) References Cited

U.S. PATENT DOCUMENTS

| | | | | |
|---|---|---|---|---|
| 8,946,804 B2* | 2/2015 | Sim | .................... | H01L 27/11519 257/315 |
| 2013/0256761 A1* | 10/2013 | Sim | .................... | H01L 27/11519 257/208 |
| 2014/0061759 A1* | 3/2014 | Lee | .................... | H01L 29/66825 257/321 |
| 2017/0236814 A1* | 8/2017 | Ryu | ....................... | G06F 30/398 257/774 |
| 2021/0335614 A1* | 10/2021 | Ho | .................... | H01L 21/28506 |

* cited by examiner

*Primary Examiner* — Nicholas J Tobergte
(74) *Attorney, Agent, or Firm* — Muncy, Geissler, Olds & Lowe, P.C.

(57) ABSTRACT

The present disclosure provides a semiconductor device structure with an air gap structure and a method for forming the semiconductor device structure. The semiconductor device structure includes a first conductive contact and a second conductive contact disposed over a semiconductor substrate. The semiconductor device structure also includes a first dielectric layer surrounding the first conductive contact and the second conductive contact, and a second dielectric layer disposed over the first conductive contact, the second conductive contact and the first dielectric layer. The first dielectric layer is separated from the semiconductor substrate by a first air gap structure, the first dielectric layer is separated from the second dielectric layer by a second air gap structure, and the air gap structures reduce capacitive coupling between conductive features.

20 Claims, 23 Drawing Sheets

SEMICONDUCTOR DEVICE STRUCTURE WITH AIR GAP STRUCTURE AND METHOD FOR PREPARING THE SAME

TECHNICAL FIELD

The present disclosure relates to a semiconductor device structure and a method for preparing the same, and more particularly, to a semiconductor device structure with an air gap structure for reducing capacitive coupling between conductive features and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as increased parasitic capacitance between adjacent conductive elements, which results in increased power consumption and unwanted resistive-capacitive (RC) delay (i.e., signal delay). Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure comprises: a semiconductor substrate having a pattern-dense region and a pattern-loose region; an isolation member defining a first active area and a second doped region in the pattern-dense region; a first doped region and a second doped region positioned in the first active area and the second active area; a first metal plug disposed on the first doped region and a second metal plug disposed on the first doped region in the second active area; a third metal plug and a fourth metal plug disposed over a pattern-loose region of the semiconductor substrate; and a dielectric layer disposed over the pattern-dense region and the pattern-loose region of the semiconductor substrate, wherein a first portion of the dielectric layer between the first metal plug and the second metal plug is separated from the semiconductor substrate by a first air gap, and a second portion of the dielectric layer between the third metal plug and the fourth metal plug is in direct contact with the semiconductor substrate.

In some embodiments, a height of the second portion is greater than a height of the first portion.

In some embodiments, the height of the second portion is substantially the same as a height of the third metal plug.

In some embodiments, a width of the second portion of the dielectric layer is greater than a width of the first portion of the dielectric layer.

In some embodiments, the first air gap is enclosed by a liner layer.

In some embodiments, the first metal plug is separated from the second metal plug by a first distance, the third metal plug is separated from the fourth metal plug by a second distance, and the second distance is greater than the first distance.

In some embodiments, the first metal plug, the second metal plug, the third metal plug, and the fourth metal plug are covered by the dielectric layer, and a top surface of the first metal plug is higher than a bottom surface of the first portion of the dielectric layer.

In some embodiments, the semiconductor device structure further comprising: a first word line buried in a first trench adjacent to the first doped region; a high-level bit line contact positioned on the first doped region; a second air gap surrounding the high-level bit line contact; wherein the first word line comprises a lower electrode structure and an upper electrode structure on the lower electrode structure; wherein the upper electrode structure comprises: a source layer substantially covering a sidewall of the first trench; a conductive layer disposed on the source layer; and a work-function adjustment layer disposed between the source layer and the conductive layer.

In some embodiments, the semiconductor device structure further comprising: a second word line buried in a second trench in the second active area of the semiconductor substrate, the second active area being separated from the first active area by the isolation member, and the second doped region being positioned adjacent to the second word line; a low-level bit line positioned over the second doped region; and a third second air gap positioned adjacent to the low-level bit line.

In some embodiments, the semiconductor device structure further comprising: a high-level bit line positioned on the high-level bit line contact; and a low-level bit line contact positioned between the low-level bit line and the second doped region; wherein a height of the low-level bit line contact is less than a height of the high-level bit line contact.

In some embodiments, a width of the low-level bit line is greater than a width of the low-level bit line contact.

In some embodiments, a width of the high-level bit line is greater than a width of the high-level bit line contact.

In some embodiments, a height of the high-level bit line contact is substantially the same as a combined height of the low-level bit line contact and the low-level bit line.

In some embodiments, a top surface of the high-level bit line contact and a top surface of the low-level bit line are substantially at the same level.

In some embodiments, the high-level bit line is asymmetrically positioned on the high-level bit line contact.

In some embodiments, a work function of the lower electrode structure is higher than a work function of the upper electrode structure.

In some embodiments, the work-function adjustment layer conformally covers an inner sidewall of the source layer.

In some embodiments, the source layer extends between the lower electrode structure and the conductive layer to cover a top surface of the lower electrode structure.

In some embodiments, the work-function adjustment layer includes a metal or a metal nitride, and wherein the work-function adjustment element includes lanthanum (La).

In one embodiment of the present disclosure, a method for forming a semiconductor device structure, comprising: forming a first metal plug, a second metal plug, a third metal plug, and a fourth metal plug over a semiconductor substrate, wherein the first metal plug and the second metal plug are formed over a pattern-dense region of the semiconductor substrate, and the third metal plug and the fourth metal plug are over a pattern-loose region of the semiconductor substrate; forming an energy removable liner covering the first metal plug, the second metal plug, the third metal plug, and the fourth metal plug; performing an etching process to remove a portion of the energy removable layer from the substrate, while remaining an energy removable block between the first metal plug and the second metal plug in the cell region; forming a dielectric layer covering the energy removable block and the first metal plug, the second metal plug, the third metal plug, and the fourth metal plug; performing a thermal treating process to transform the energy removable layer into an air gap structure including an air gap enclosed by liner layer; wherein a first portion of the dielectric layer extends between the first metal plug and the second metal plug such that the first portion of the dielectric layer and the semiconductor substrate are separated by the air gap while a second portion of the dielectric layer extends between the third metal plug and the fourth metal plug such that the second portion of the dielectric layer is in direct contact with the semiconductor substrate.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
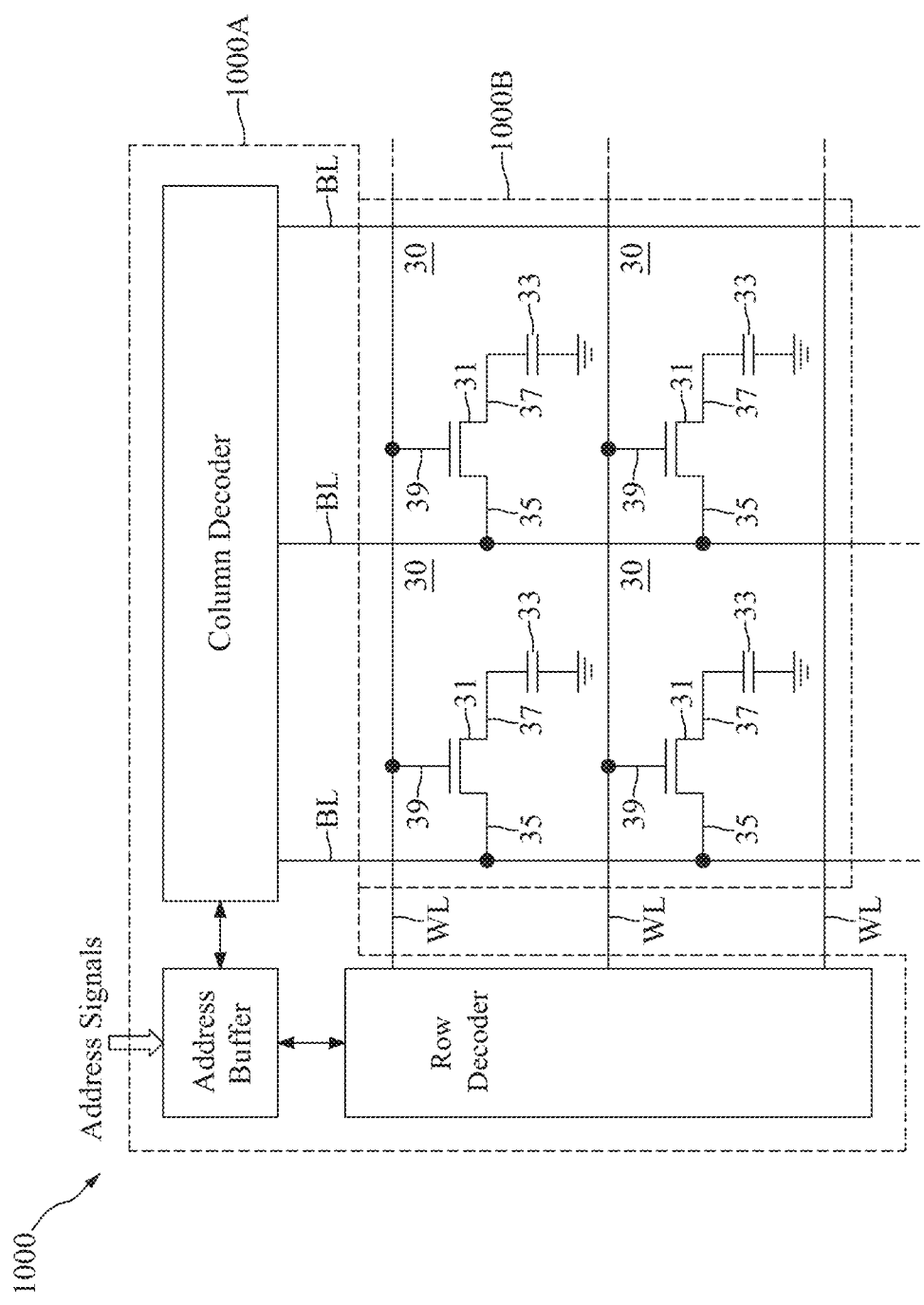
FIG. 1 is a top view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram illustrating an exemplary integrated circuit, such as a memory device 1000, in accordance with some embodiments. In some embodiments, the memory device 1000 includes an array of memory cells 30 in a cell region 1000B and a peripheral circuit region 1000A adjacent to the cell region 1000B. In some embodiments, the memory device 1000 includes a dynamic random-access memory (DRAM) device. In some embodiments, the memory device 1000 includes a number of memory cells 30 arranged in a grid pattern and including a number of rows and columns. The number of memory cells 30 may vary depending on system requirements and fabrication technology. In some embodiments, the cell region 1000B is considered a pattern-dense region, while the peripheral circuit region 1000A is considered a pattern-loose region.

In some embodiments, each of the memory cells 30 includes an access device and a storage device. The access device is configured to provide controlled access to the storage device. In particular, the access device is a field effect transistor (FET) 31 and the storage device is a capacitor 33, in accordance with some embodiments. In each of the memory cells 30, the FET 31 includes a drain 35, a source 37 and a gate 39. One terminal of the capacitor 33 is electrically connected to the source 37 of the FET 31, and the other terminal of the capacitor 33 may be electrically connected to the ground. In addition, in each of the memory cells 30, the gate 39 of the FET 31 is electrically connected to a word line WL, and the drain 35 of the FET 31 is electrically connected to a bit line BL.

The above description mentions the terminal of the FET 31 electrically connected to the capacitor 33 is the source 37, and the terminal of the FET 31 electrically connected to the bit line BL is the drain 35. However, during read and write operations, the terminal of the FET 31 electrically connected to the capacitor 33 may be the drain, and the terminal of the FET 31 electrically connected to the bit line BL may be the source. That is, either terminal of the FET 31 could be a source or a drain depending on the manner in which the FET 31 is being controlled by the voltages applied to the source, the drain and the gate.

By controlling the voltage applied to the gate 39 via the word line WL, a voltage potential may be created across the FET 30 such that the electrical charge can flow from the drain 35 to the capacitor 33. Therefore, the electrical charge stored in the capacitor 33 may be interpreted as a binary data value stored in the memory cell 30. For example, a positive charge above a threshold voltage stored in the capacitor 33 may be interpreted as binary "1." If the charge in the capacitor 33 is below the threshold value, a binary value of "0" is said to be stored in the memory cell 30.

The bit lines BL are configured to read and write data to and from the memory cells 30. The word lines WL are configured to activate the field effect transistors (FET) 31 to access a particular row of the memory cells 30. Accordingly, the memory device 1000 also includes the peripheral circuit region 1000A, which may include an address buffer, a row decoder and a column decoder. The row decoder and the column decoder selectively access the memory cells 30 in response to address signals that are provided to the address buffer during read, write and refresh operations. The address signals are typically provided by an external controller such as a microprocessor or another type of memory controller.

Figure 2:
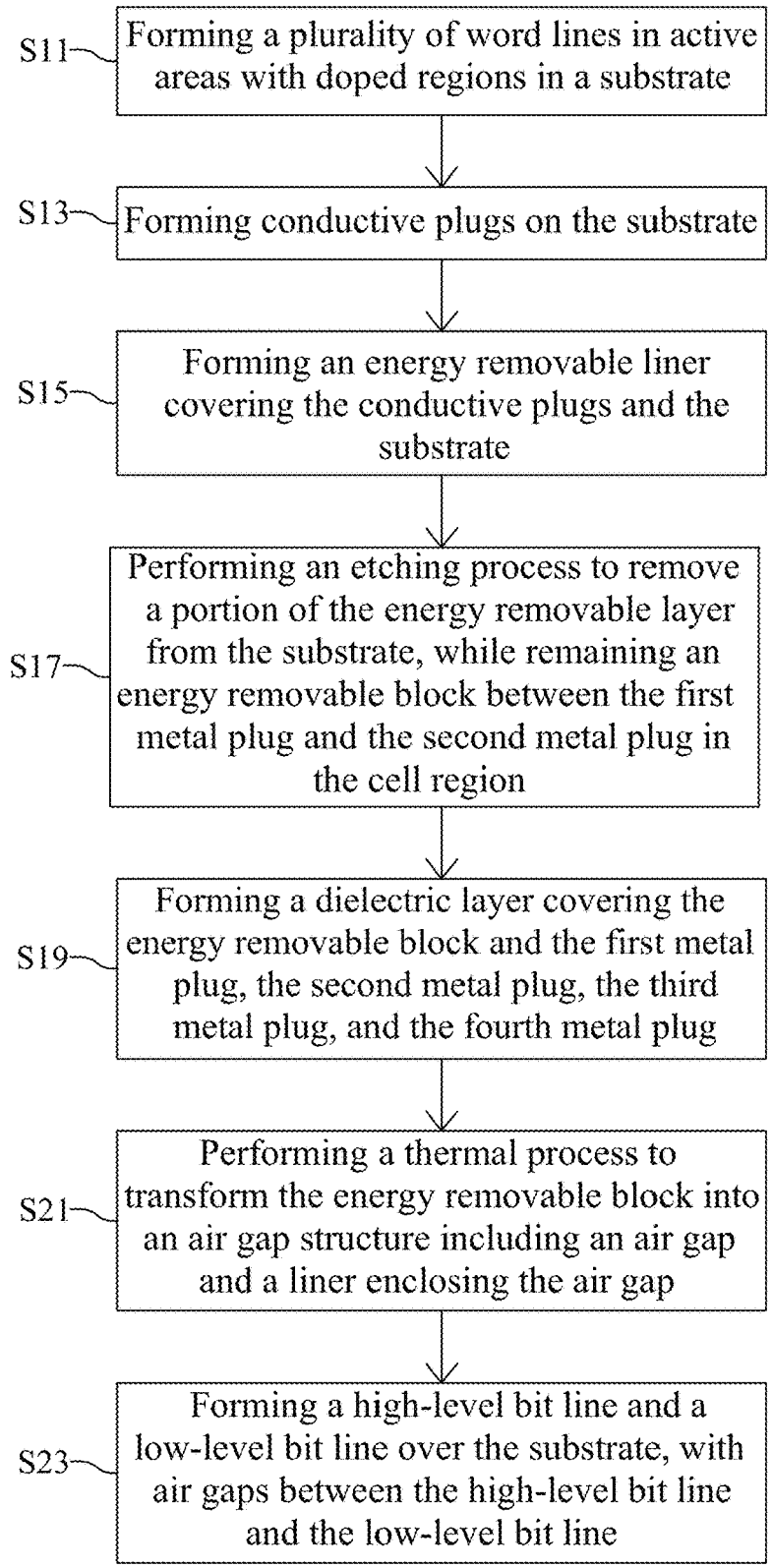
FIG. 2 is a cross-sectional view illustrating the semiconductor device structure along the sectional line I-I' in FIG. 1, in accordance with some embodiments.

FIG. 2 is a flow diagram illustrating a method M10 of preparing the semiconductor device structure 1000, in accordance with some embodiments. The method 10 includes steps S11, S13, S15, S17, S19, S21 and S23, which are elaborated in connection with following figures.

Figure 3:
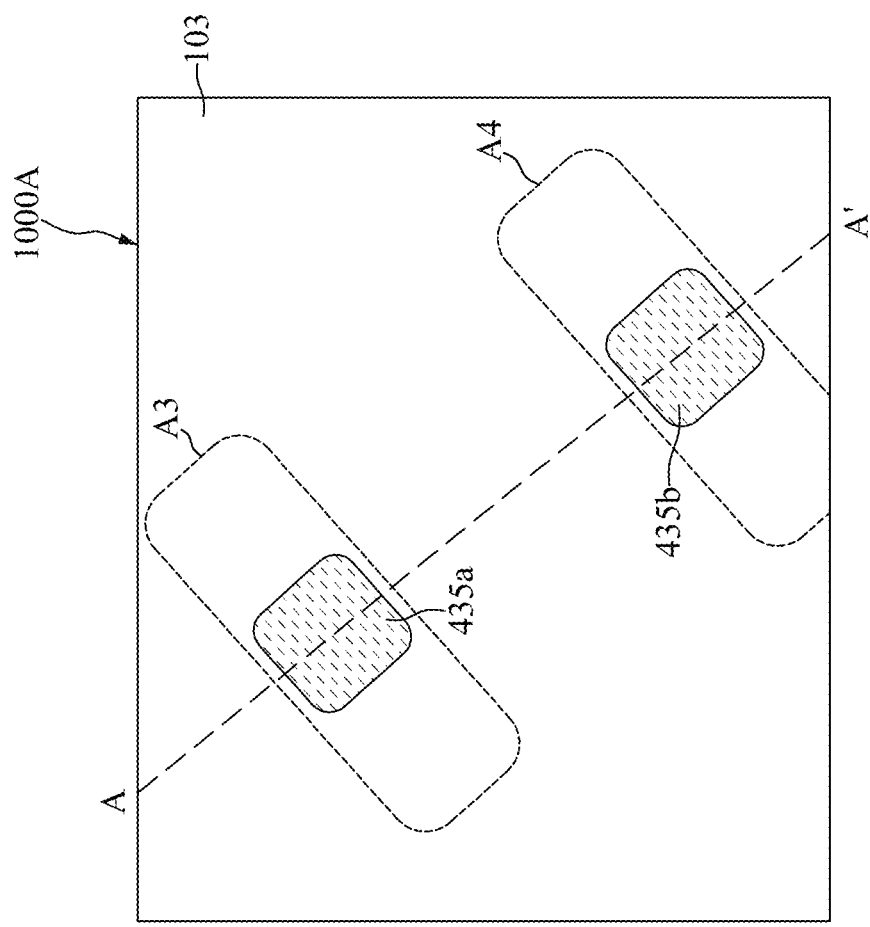
FIG. 3 is a flow diagram illustrating a method of forming a semiconductor device structure, in accordance with some embodiments.
Figure 4:
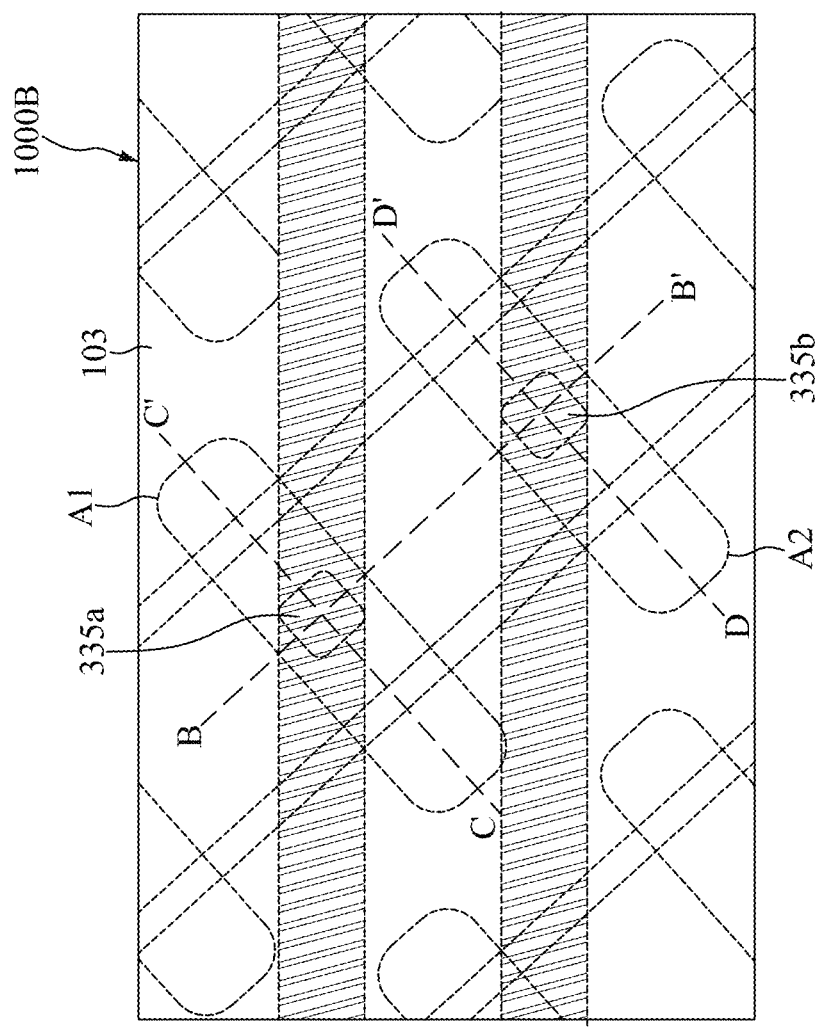
FIG. 4 is a top view illustrating an intermediate stage of forming active areas and isolation structures during the formation of the semiconductor device structure, in accordance with some embodiments.
Figure 5:
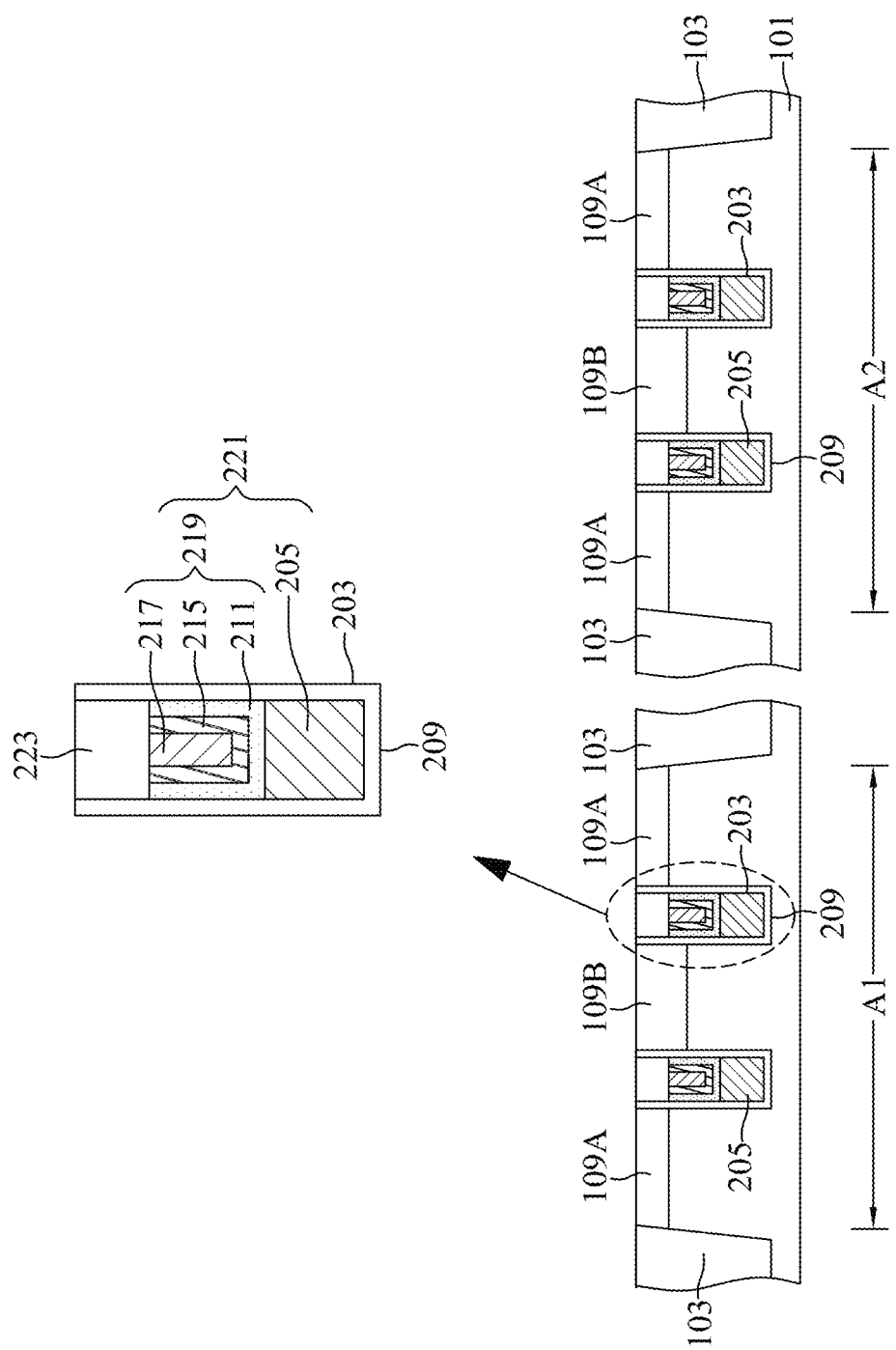
FIG. 5 is a cross-sectional view illustrating an intermediate stage of forming active areas and isolation structures during the formation of the semiconductor device structure along the sectional line I-I' in FIG. 4, in accordance with some embodiments.

FIG. 3 is a top view illustrating a layout of the peripheral region 1000A in the semiconductor device structure 1000, and FIG. 4 is a top view illustrating a layout of the cell region 1000B in the semiconductor device structure 1000 in accordance with some embodiments. FIG. 5 is a cross-sectional view illustrating an intermediate stage of forming a plurality of word lines in active areas with doped regions in a substrate at the step S11 in the method M10 shown in FIG. 2, in accordance with some embodiments. It should be noted that FIG. 5 is a cross-sectional view along the sectional line C-C' and D-D' of FIG. 4. In some embodiments, fabrication processes are performed to form an isolation member 103 defining a first active area A1 and a second active area A2 in a substrate 101. The first active area A1 and the second active area A2 may be adjacent to each other. For example, the isolation member 103 may be formed using a shallow-trench isolation (STI) method. The isolation member 103 may include at least one of a silicon nitride layer, a silicon oxide layer, or a silicon oxynitride layer. The isolation member 103 may extend into the substrate 101.

In some embodiments, the substrate 11 may be a semiconductor wafer such as a silicon wafer. Alternatively or additionally, the substrate 11 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the substrate 11 includes an epitaxial layer. For example, the substrate 11 has an epitaxial layer overlying a bulk semiconductor. In some embodiments, the substrate 11 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

In some embodiments, the substrate 11 may be a variety of materials, including, but not limited to, sapphire, silicon, gallium nitride (GaN), germanium, or silicon carbide. The substrate 11 may be silicon on insulator (SOI). In some embodiments of the present disclosure, the substrate 11 is silicon. crystallographic orientation of a substantially monocrystalline substrate 11 may be any of (100), (111), or (110) on the Miller Indices. Other crystallographic orientations are also possible. The crystallographic orientations of substrate 11 may be offcut. In some embodiments of the present disclosure, the substrate 11 is (100) silicon with crystalline substrate surface region having cubic crystallinity. In another embodiment, for a (100) silicon substrate 11, the semiconductor surface may be miscut, or offcut, for example 2-10. degree. toward (110). In another embodiment, substrate 11 is (111) silicon with crystalline substrate surface region having hexagonal crystallinity.

In some embodiments, still referring to FIG. 5, a plurality of first doped regions 109A and second doped regions 109B may be formed in an upper portion of the first active area A1 of the substrate 101 and an upper portion of the second active area A2 of the substrate 101. The plurality of first doped regions 109A and second doped regions 109B may be doped with a dopant such as phosphorus, arsenic, or antimony. The first doped regions 109A and second doped regions 109B may be formed using an ion implantation process.

In some embodiments, a plurality of word line trenches 209 may be inwardly formed in the upper portion of the first active area A1 and the upper portion of the second active area A2, respectively. The bottoms of the plurality of word line trenches 209 may be at a vertical level lower than a vertical level of bottoms of the plurality of first doped regions 109A.

In some embodiments, still referring to FIG. 5, fabrication processes are performed to form a lower electrode structure substantially filling a lower portion of the word line trenches 209 in accordance with some embodiments. In some embodiments, a plurality of word line insulating layers 203 may be respectively correspondingly formed in the plurality of word line trenches 209, and a plurality of lower electrode structures 205 may be formed in a lower portion of each of the word line trenches 209 in which the insulating layer 203 is formed.

In some embodiments, still referring to FIG. 5, the insulating layer 203 may be formed using a thermal oxidation process, an atomic layer deposition (ALD) process, and/or a chemical vapor deposition (CVD) process. For example, the insulating layer 203 may include a silicon oxide layer. In some embodiments, a conductive material may be deposited on substantially an entire top surface of the substrate 101 having the insulating layer 203. At this time, the conductive material may substantially fill the trenches 209. The deposition of the conductive material may be performed using a chemical vapor deposition (CVD) process. The conductive material may include at least one of a doped semiconductor material (e.g., doped silicon or doped germanium), a conductive metal nitride (e.g., titanium nitride or tantalum nitride), a metal (e.g., tungsten, titanium, or tantalum), or a metal-semiconductor compound (e.g., tungsten silicide, cobalt silicide, or titanium silicide). Subsequently, the deposited conductive material may be etched to form the lower electrode structures 205. The etching process may be continuously performed until the conductive material remains with a desired thickness in the trenches 209.

In some embodiments, still referring to FIG. 5, fabrication processes are performed to form a preliminary source layer 211 and a first diffusion layer 213 on a sidewall and a bottom surface of each of the trenches 209, wherein the preliminary source layer 211 may include a work-function adjustment element. In some embodiments, the preliminary source layer 211 may be formed to conformally cover top surfaces of the lower electrode structures 205 and the insulating layer 203. The preliminary source layer 211 may be formed using a chemical vapor deposition (CVD) process. The preliminary source layer 211 may include a work-function adjustment element or a compound of the work-function adjustment element. For example, the work-function adjustment element may include a metal such as lanthanum, strontium, antimony, yttrium, aluminum, tantalum, hafnium, iridium, zirconium, or magnesium.

In some embodiments, still referring to FIG. 5, the first diffusion layer 213 may be formed to conformally cover the preliminary source layer 211. The first diffusion layer 213 may be formed using a chemical vapor deposition (CND) process. The first diffusion layer 213 may include a metal material or a nitride of the metal material. The metal material may include a metal element different from the work-function adjustment element. For example, the metal material may include a metal element such as titanium or tungsten.

In some embodiments, still referring to FIG. 5, fabrication processes are performed to form a work-function adjustment layer 215 in accordance with some embodiments. In some embodiments, the work-function adjustment layer 215 may be formed by doping the first diffusion layer 213 with the work-function adjustment element from the source layer 211. The work-function adjustment layer 215 may have an effective work function lower than that of the first diffusion layer 213. For example, the work-function adjustment element of the preliminary source layer 211 may be diffused into the first diffusion layer 213 to form the work-function adjustment layer 215. The diffusion of the work-function adjustment element may be performed by a thermal treatment process (e.g., an annealing process). The work-function adjustment element of the preliminary source layer 211 may be diffused into the first diffusion layer 213 by the thermal treatment process. At this time, substantially the entire first diffusion layer 213 may be doped with the work-function adjustment element, and thus the first diffusion layer 213 may be completely formed or converted into the work-function adjustment layer 215. Thus, the first diffusion layer 213 need not remain after the diffusion of the work-function adjustment element of the preliminary source layer 211 into the first diffusion layer 213. Since the work-function adjustment element of the preliminary source layer 211 is diffused into the first diffusion layer 213, a thickness of the preliminary source layer 211 may be reduced.

In an exemplary embodiment of the present disclosure, oxygen or nitrogen generated by decomposing the compound of the work-function adjustment element may be diffused toward the lower electrode structure 205. As an example, the work-function adjustment element generated by the decomposition of the thermal treatment process may be diffused into the first diffusion layer 213 and the remaining oxygen or nitrogen may be diffused toward the lower electrode structure 205. In some embodiments, after the diffusion process (e.g., the thermal treatment process), substantially the entire first diffusion layer 213 may be doped with the work-function adjustment element and the first diffusion layer 213 might not remain. However, exemplary embodiments of the present disclosure are not limited thereto. In an exemplary embodiment of the present disclosure, a portion of the first diffusion layer 213 adjacent to the conductive layer 252 need not be doped with the work-function adjustment element, but may remain.

In some embodiments, still referring to FIG. 5, fabrication processes are performed to form a conductive layer 217 on the first diffusion layer in accordance with some embodiments. In some embodiments, the conductive layer 217 may fill remaining portions of the trenches 209 and may cover substantially an entire top surface of the substrate 101 having the first diffusion layer 213. For example, the conductive layer 217 may cover substantially an entire surface of the first diffusion layer 213 opposite the preliminary source layer 211. The conductive layer 217 may include a low-resistance material of which a resistance is lower than that of the first diffusion layer 213. For example, the conductive layer 217 may include a metal such as tungsten, titanium, or tantalum. The conductive layer 217 including a conductive material may be formed on the first diffusion layer 213 including the metal or the metal nitride.

In some embodiments, still referring to FIG. 5, fabrication processes are performed to form a plurality of word lines in the trenches 209 in the substrate 101 in accordance with some embodiments. In some embodiments, the conductive layer 217, the work-function adjustment layer 215, and the preliminary source layer 211 may be etched to form an upper electrode structure 219 in each of the trenches 209. The etching process may be continuously performed until the preliminary source layer 211, the work-function adjustment layer 215 and the conductive layer 217 remain with desired thicknesses in the trenches 209. Top surfaces of the source layer 211, the work-function adjustment layer 215 and the conductive layer 217 formed by the etching process may be disposed at the same level.

Subsequently, the insulating layer 203 which is not covered by the upper electrode structure 219 but is exposed may be removed. Thus, gate insulating patterns 203 may be formed between the active areas A1, A2 and the electrode structures 205 and 217 and/or between the isolation member 103 and the electrode structures 205 and 217. In addition, top surfaces of the isolation member 103 and the active areas A1, A2 may be exposed by the etching process.

In some embodiments, still referring to FIG. 5, fabrication processes are performed to form a second doped region 109B in the active areas A1, A2 between two word lines 221 adjacent to each other, in accordance with some embodiments. In some embodiments, an ion implantation process may be performed on the substrate 101 to form the second doped region 109B in the active areas A1, A2 between two word lines 221 adjacent to each other. The second doped region 109B may have the same conductivity type as the second dopant injection region 109A. For example, the second doped region 109B may be doped with N-type dopants. in some embodiments, the second doped region 109B may be deeper than the first doped region 109A in the substrate 101.

In some embodiments, still referring to FIG. 5, first capping patterns 223 may be formed in the trenches 209, respectively. For example, a capping layer may be formed on substantially an entire top surface of the substrate 101, and then, a planarization process may be performed on the capping layer to form the first capping patterns 223. The first capping patterns 223 may include at least one of a silicon nitride layer, a silicon oxide layer, or a silicon oxynitride layer.

Figure 6:
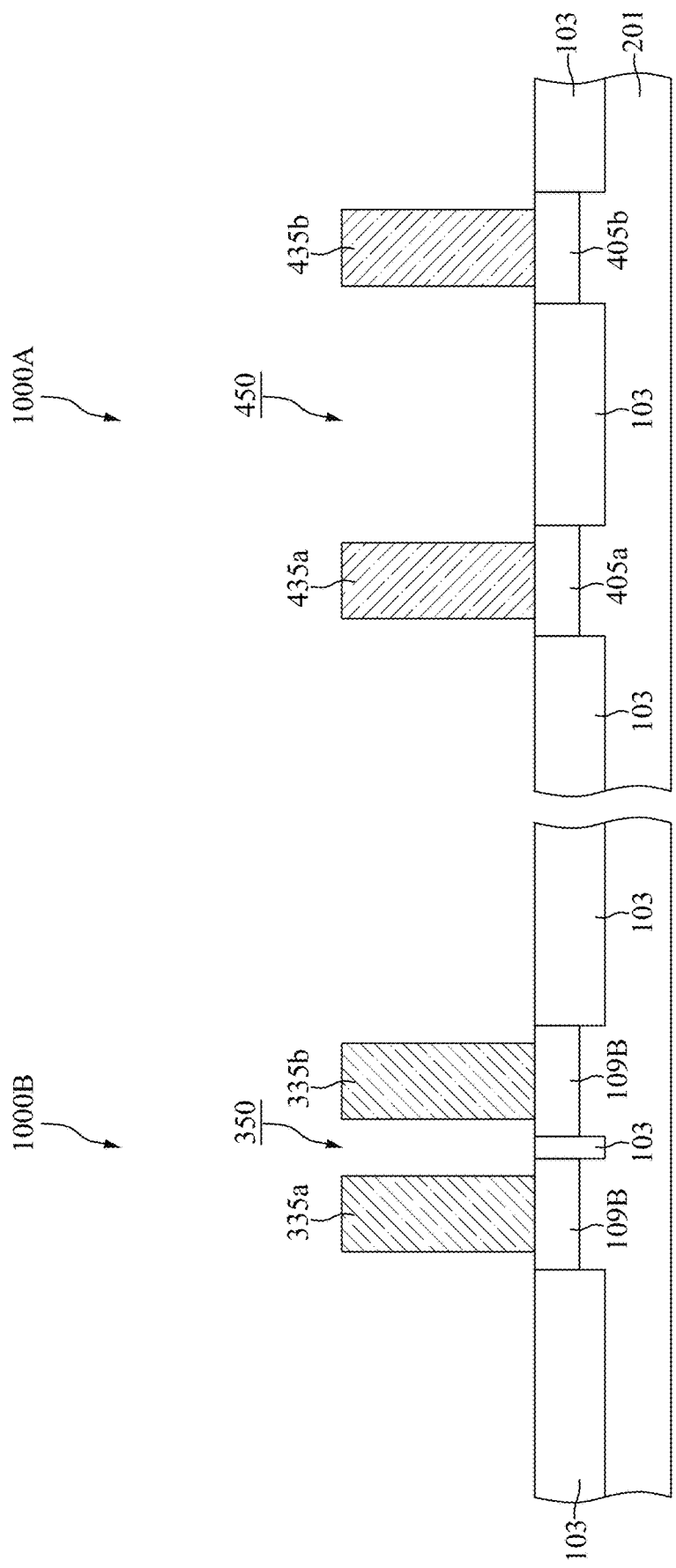
FIG. 6 is a top view illustrating an intermediate stage of forming energy removable layers during the formation of the semiconductor device structure, in accordance with some embodiments.

FIG. 6 is a cross-sectional views illustrating intermediate stages in the formations of conductive members on the substrate at the step S13 in the method M10 shown in FIG. 2, in accordance with some embodiments. As shown in FIG. 6, conductive members such as a first metal plugs 335a and a second metal plug 335b are formed over the doped regions 109B in the cell region 1000B, and conductive members such as a third metal plugs 435a and a fourth metal plug 435b are formed over the doped regions 405a and 405b in the peripheral circuit region 1000A. In some embodiments, the space 350 between the conductive members 335a, 335b in the cell region 1000B is relatively small; in contrast, the space 450 between the conductive members 435a and 435b in the peripheral circuit region 1000A are relatively large. Therefore, the cell region 1000B is considered a pattern-dense region, while the peripheral circuit region 1000A is considered a pattern-loose region.

Figure 7:
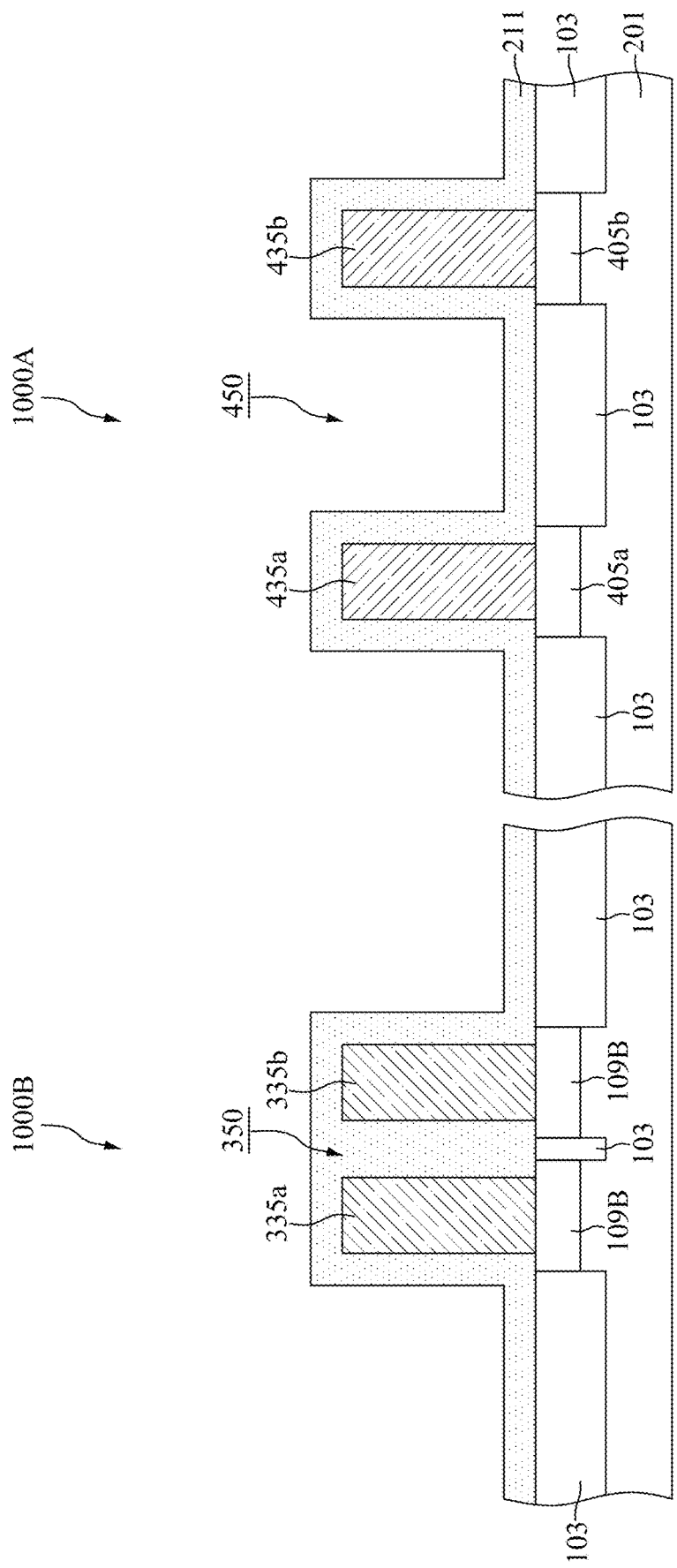
FIG. 7 is a cross-sectional view illustrating an intermediate stage of forming energy removable layers during the formation of the semiconductor device structure along the sectional line I-I' in FIG. 6, in accordance with some embodiments.

FIG. 7 is a cross-sectional views illustrating intermediate stages in the formations of an energy removable liner 211 covering the conductive members and the substrate at the step S15 in the method M10 shown in FIG. 2, in accordance with some embodiments. As shown in FIG. 7, the energy removable liner 211 covers the conductive member 335a, 335b, 435a, 435b and the substrate 10. In some embodiments, the energy removable liner 211 fills the space 350 between the conductive members 335a, 335b in the cell region 1000B, because the space 350 is small; in contrast, the space 450 between the conductive members 435a and 435b are relatively large, and the energy removable liner 211 is not able to fill the space 450. In some embodiments, the energy removable liner 211 includes a thermal decomposable material. In some other embodiments, the energy removable layer 211 includes a photonic decomposable material, an e-beam decomposable material, or another applicable energy decomposable material. Specifically, in some embodiments, the energy removable layer 211 includes a base material and a decomposable porogen material that is substantially removed once being exposed to an energy source (e.g., heat).

In some embodiments, the base material includes hydrogen silsesquioxane (HSQ), methylsilsesquioxane (MSQ), porous polyarylether (PAE), porous SiLK, or porous silicon oxide (SiO2), and the decomposable porogen material includes a porogen organic compound, which can provide porosity to the space originally occupied by the energy removable layer 211 and the second energy removable layer 115 in the subsequent processes.

Figure 8:
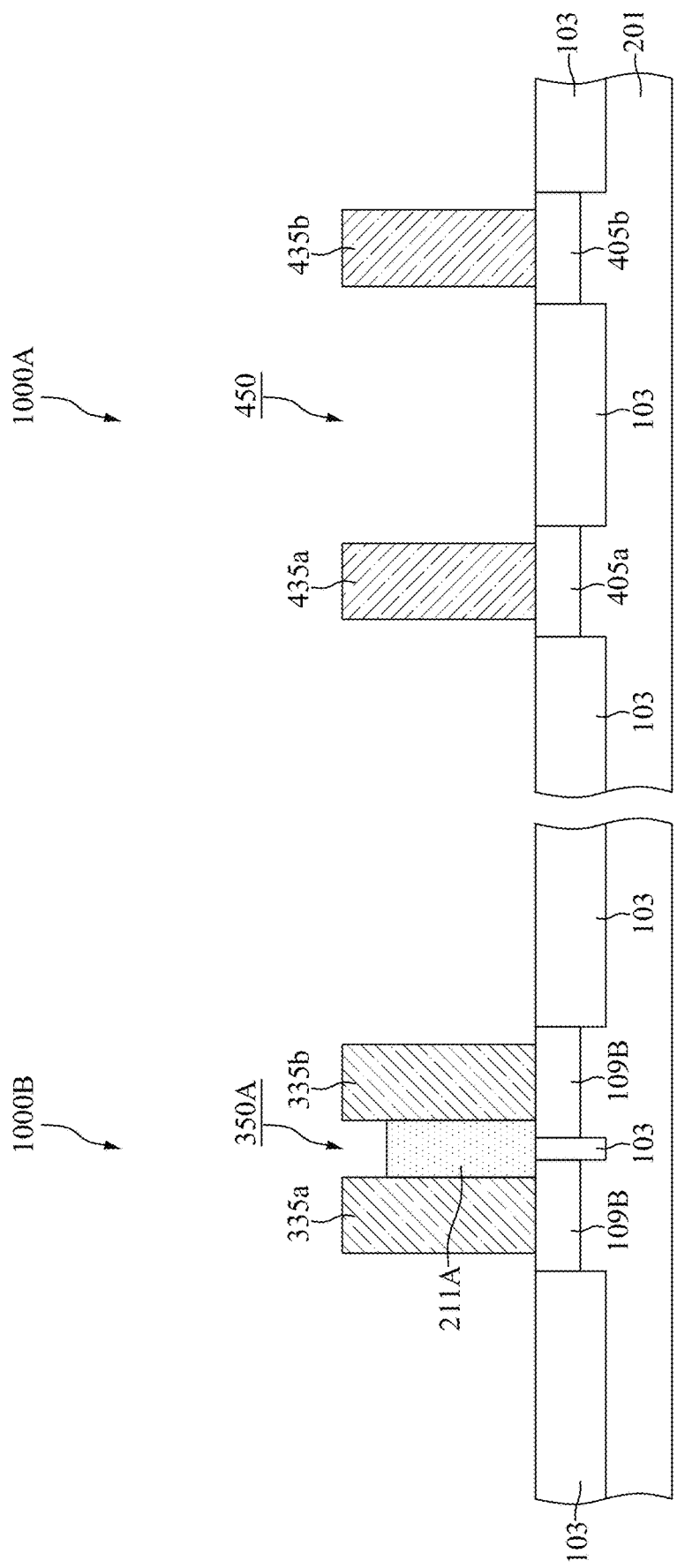
FIG. 8 is a top view illustrating an intermediate stage of forming a patterned mask during the formation of the semiconductor device structure, in accordance with some embodiments.

FIG. 8 is a cross-sectional views illustrating intermediate stages of performing an etching process to remove a portion of the energy removable layer 211 from the substrate 101 at the step S17 in the method M10 shown in FIG. 2, in accordance with some embodiments. As shown in FIG. 8, in some embodiments, an etching process is performed to remove a portion of the energy removable liner 211 from the substrate 101, while remaining an energy removable block 211A between the first metal plug 335a and the second metal plug 335b in the cell region 1000B. Since the space 350 between the first metal plug 335a and the second metal plug 335b in the cell region 1000B is less than the space 450 between the third metal plug 435a and the fourth metal plug 435b in the peripheral circuit region 1000A, a lower portion of the energy removable liner 211 remains between the first metal plug 335a and the second metal plug 335b after the etching process; in contrast, the energy removable liner 211 between the third metal plug 435a and the fourth metal plug 435b in the peripheral circuit region 1000A are completely removed from the substrate 101. As a result, the energy removable block 211A is obtained between the first metal plug 335a and the second metal plug 335b in the cell region 1000B, while the third metal plug 435a and the fourth metal plug 435b are separated from each other by the space 450. In other words, the etching process forms a recess 350A between the first metal plug 335a and the second metal plug 335b in the cell region 1000B by removing a top portion of the energy removable liner 211. The etching process may be a wet etching process, a dry etching process, or a combination thereof.

Figure 9:
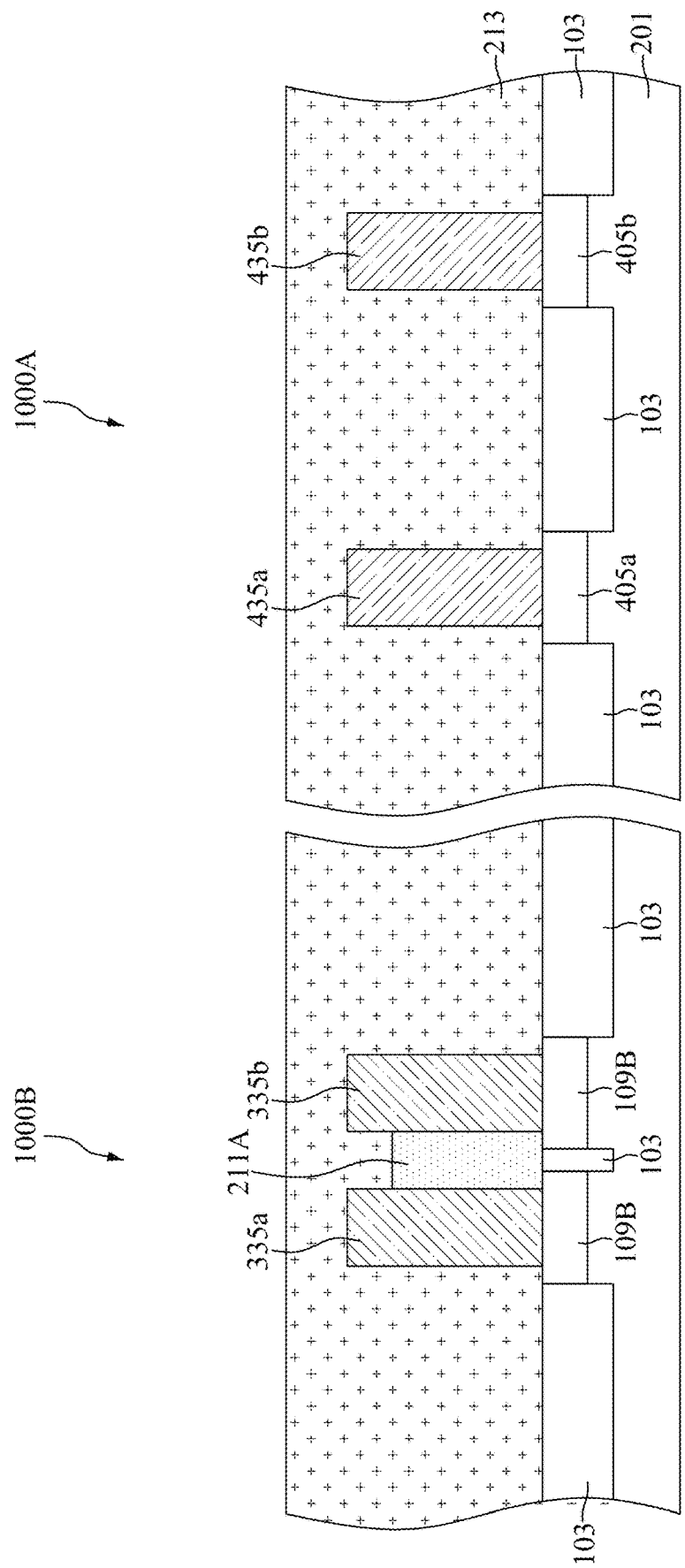
FIG. 9 is a cross-sectional view illustrating an intermediate stage of forming a patterned mask during the formation of the semiconductor device structure along the sectional line I-I' in FIG. 8, in accordance with some embodiments.

FIG. 9 is a cross-sectional views illustrating intermediate stages in the formations of a dielectric layer over the substrate at the step S19 in the method M10 shown in FIG. 2, in accordance with some embodiments. As shown in FIG. 9, in some embodiments, a dielectric layer 213 is formed to cover the semiconductor substrate 101, the conductive members 335a, 335b, 435a, 435b and the remaining energy removable block 211A in accordance with some embodiments. It should be noted that, the space 350 and the opening 450 are filled by the dielectric layer 213, and the structure in the cell region 1000B and the structure in the peripheral circuit region 1000A are entirely covered by the dielectric layer 213.

Figure 10:
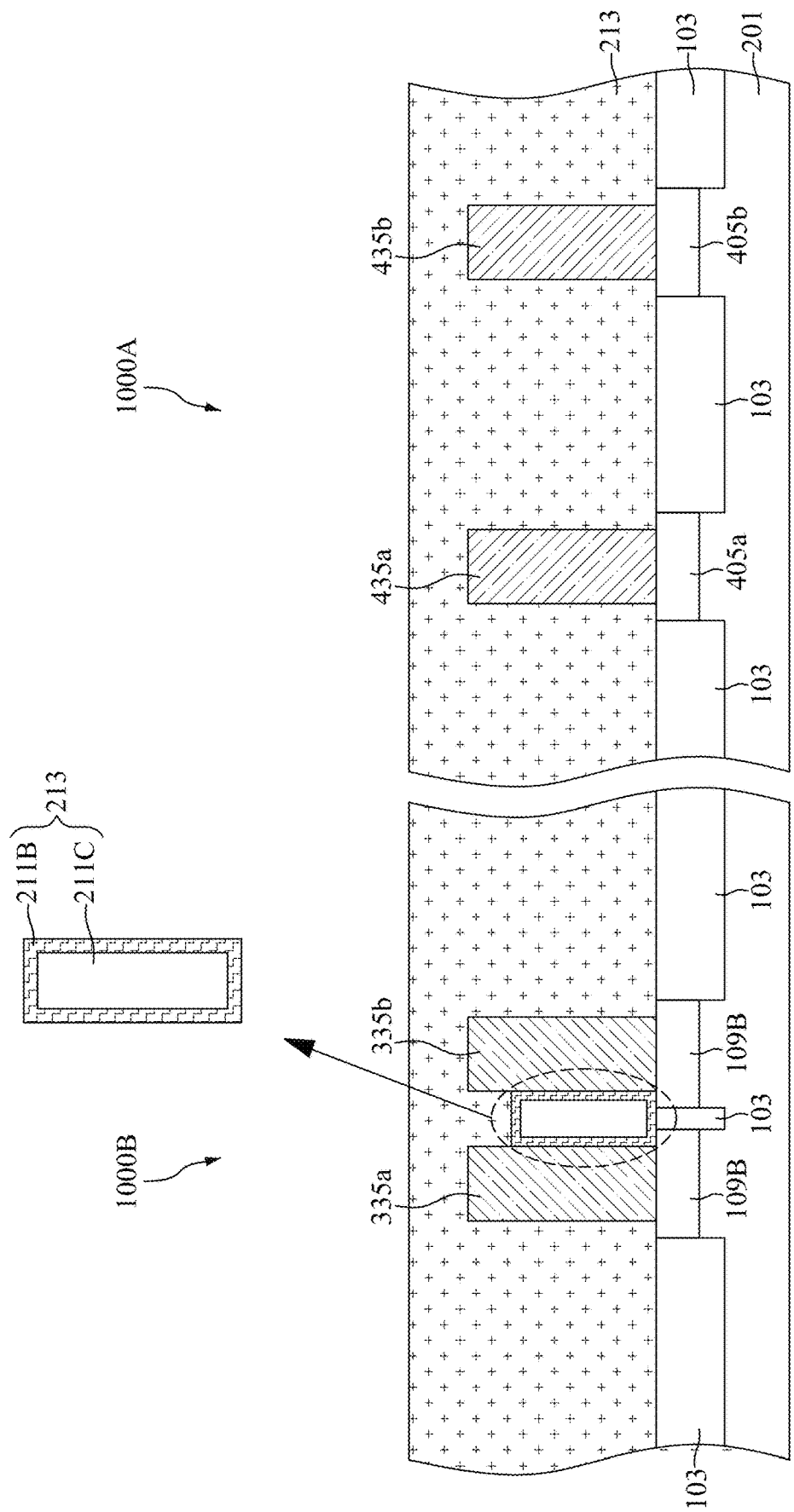
FIG. 10 is a top view illustrating an intermediate stage of forming openings in the energy removable layers during the formation of the semiconductor device structure, in accordance with some embodiments.

FIG. 10 is a cross-sectional views illustrating intermediate stages in the formations of an air gap structure between the first metal plug and the second metal plug in the cell region 1000B by performing a thermal treating process at the step S21 in the method M10 shown in FIG. 2, in accordance with some embodiments. As shown in FIG. 10, after the dielectric layer 213 is formed, a thermal treating process is performed. In some embodiments, during the thermal treating process, the remaining energy removable block 211A is transformed into an air gap structure 213 including an air gap 211C enclosed by a liner 211B.

In some embodiments, the air gap structure 213 is sealed by the dielectric layer 213, and a portion of the dielectric layer 213 extends into the space between the conductive contacts 335a and 335b, in accordance with some embodiments. In other words, the top surface of the air gap structure 213 is lower than the top surfaces of the conductive members 335a and 335b.

It should be noted that an air gap structure (i.e., the air gap structure 213) is formed in the semiconductor device structure of the cell region 1000B, while no air gap structure exists in the peripheral circuit region 1000A of the semiconductor device structure. By utilizing the different spaces between the conductive plugs in the cell region 1000B and the peripheral circuit region 1000A, air gap structure(s) may be selectively formed in the cell region 1000B (i.e., the pattern-dense region).

Figure 11:
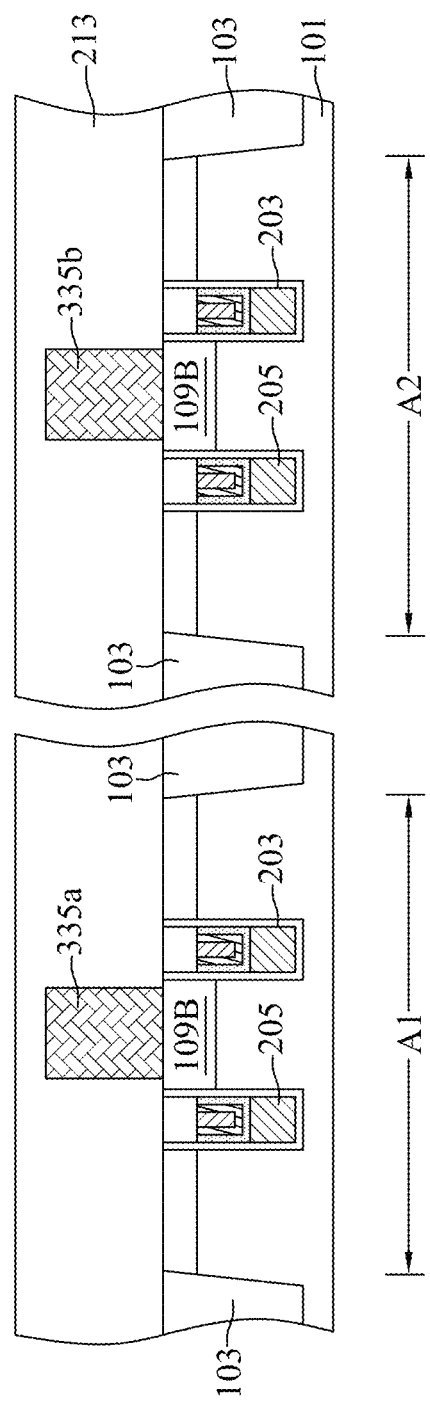
FIG. 11 is a cross-sectional view illustrating an intermediate stage of forming openings in the energy removable layers during the formation of the semiconductor device structure along the sectional line I-I' in FIG. 10, in accordance with some embodiments.
Figure 12:
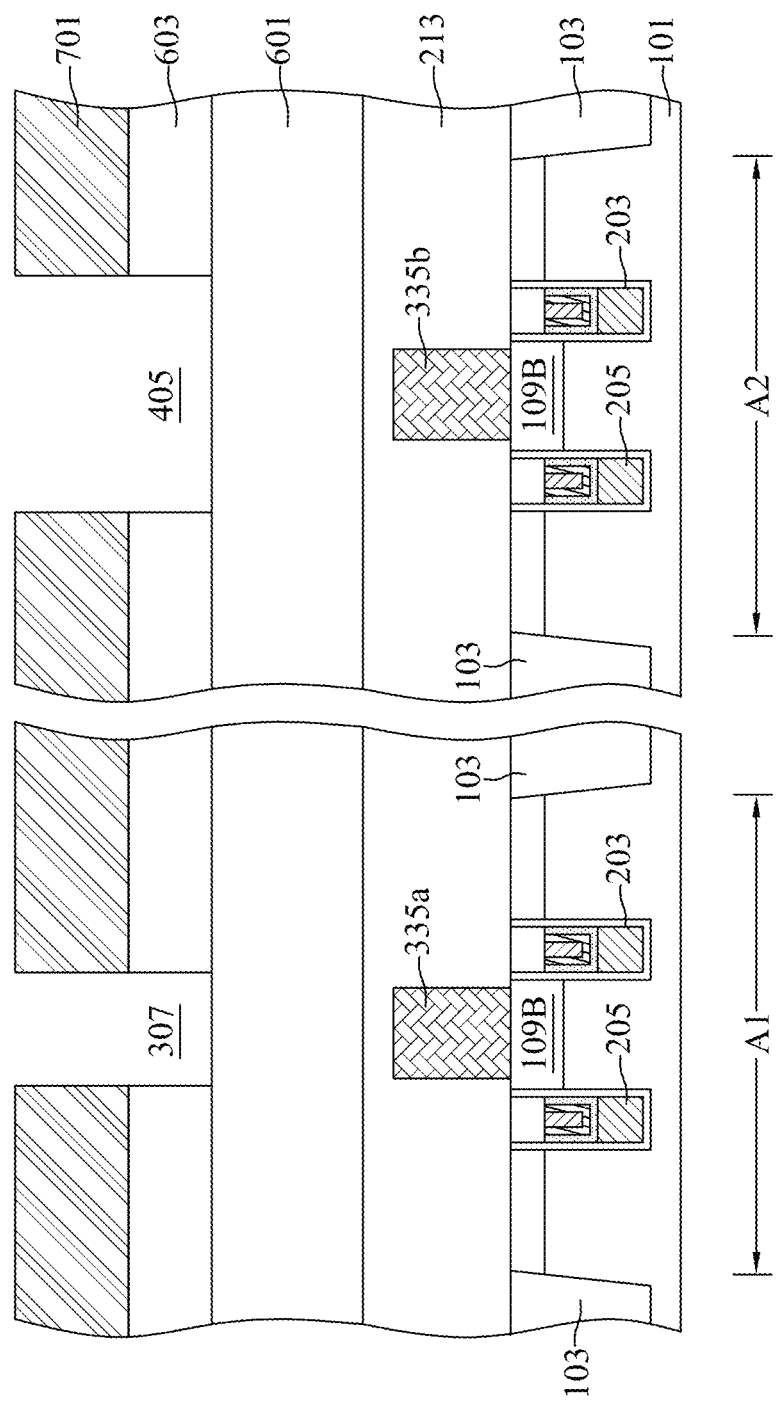
FIG. 12 is a top view illustrating an intermediate stage of forming conductive contacts in the openings during the formation of the semiconductor device structure, in accordance with some embodiments.

FIGS. 11-23 are cross-sectional views illustrating an intermediate stage of forming a high-level bit line and a low-level bit line over the substrate at the step S23 in the method M10 shown in FIG. 2, in accordance with some embodiments. It should be noted that FIGS. 11-23 are cross-sectional views along the sectional line C-C' and D-D' of FIG. 4. With reference to FIGS. 11-12, a first insulating film 601 may be formed on the dielectric 213 and a second insulating film 603 may be formed on the first insulating film 601. A first photolithography process may be performed using a first mask pattern 701 to define positions of the high-level bit line bottom contact 303 and the low-level bit line 401 on the second insulating film 603.

With reference to FIG. 12, a first etch process, such as an anisotropic dry etch process, may be performed after the first photolithography process to form an upper high-level bit line bottom contact opening 307 and a low-level bit line trench 405 in the second insulating film 603.

Figure 13:
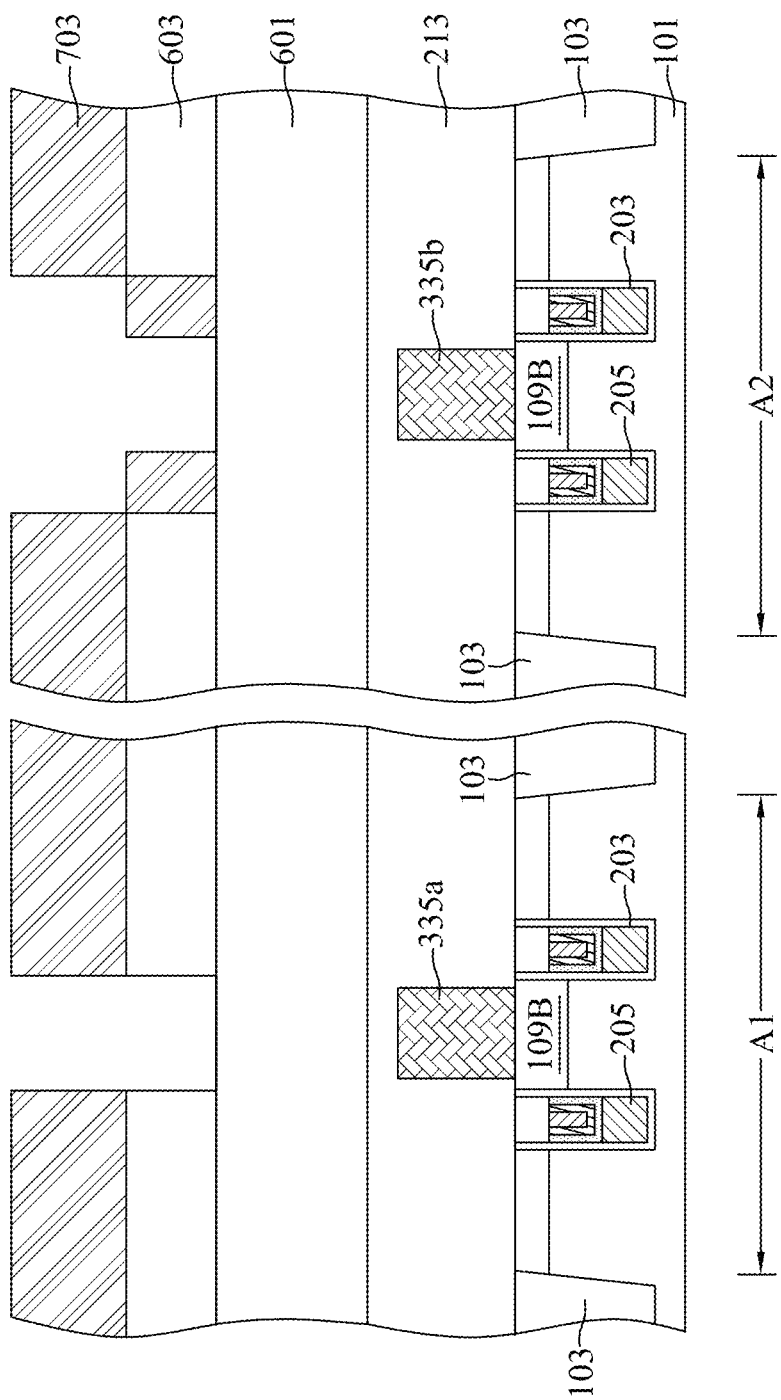
FIG. 13 is a cross-sectional view illustrating an intermediate stage of forming conductive contacts in the openings during the formation of the semiconductor device structure along the sectional line I-I' in FIG. 12, in accordance with some embodiments.

With reference to FIG. 13, a second photolithography process may be performed using a second mask pattern 703 to define the position of the high-level bit line contact 303 and a position of the low-level bit line contact 403 in the first insulating film 601.

Figure 14:
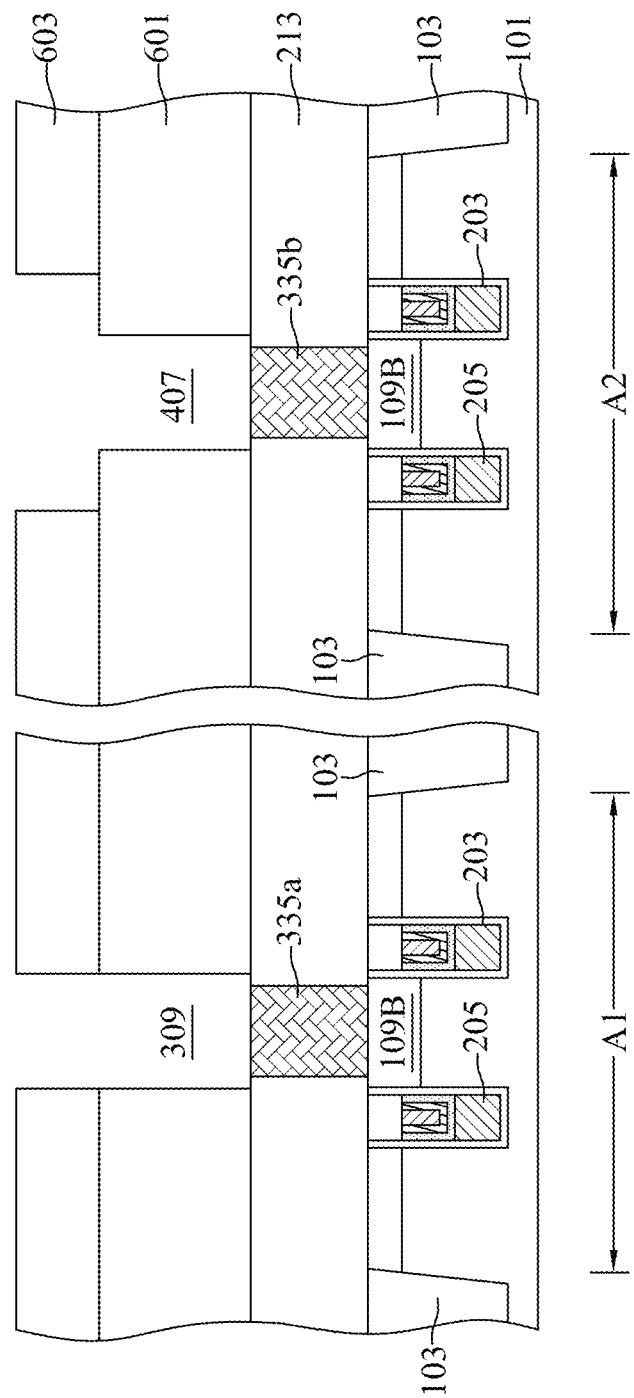
FIG. 14 is a top view illustrating an intermediate stage of forming a dielectric layer during the formation of the semiconductor device structure, in accordance with some embodiments.

With reference to FIG. 14, a second etch process, such as an anisotropic dry etch process, may be performed after the second photolithography process to form a lower high-level bit line contact opening 309 and a low-level bit line contact opening 407 in the first insulating film 601. The metal plugs 335a, 335b disposed between adjacent pairs of the plurality of word lines 201 in the first active area A1 and between adjacent pairs of the plurality of word lines 201 in the second active area A2 may be respectively exposed through the lower high-level bit line contact opening 309 and the low-level bit line contact opening 407.

Figure 15:
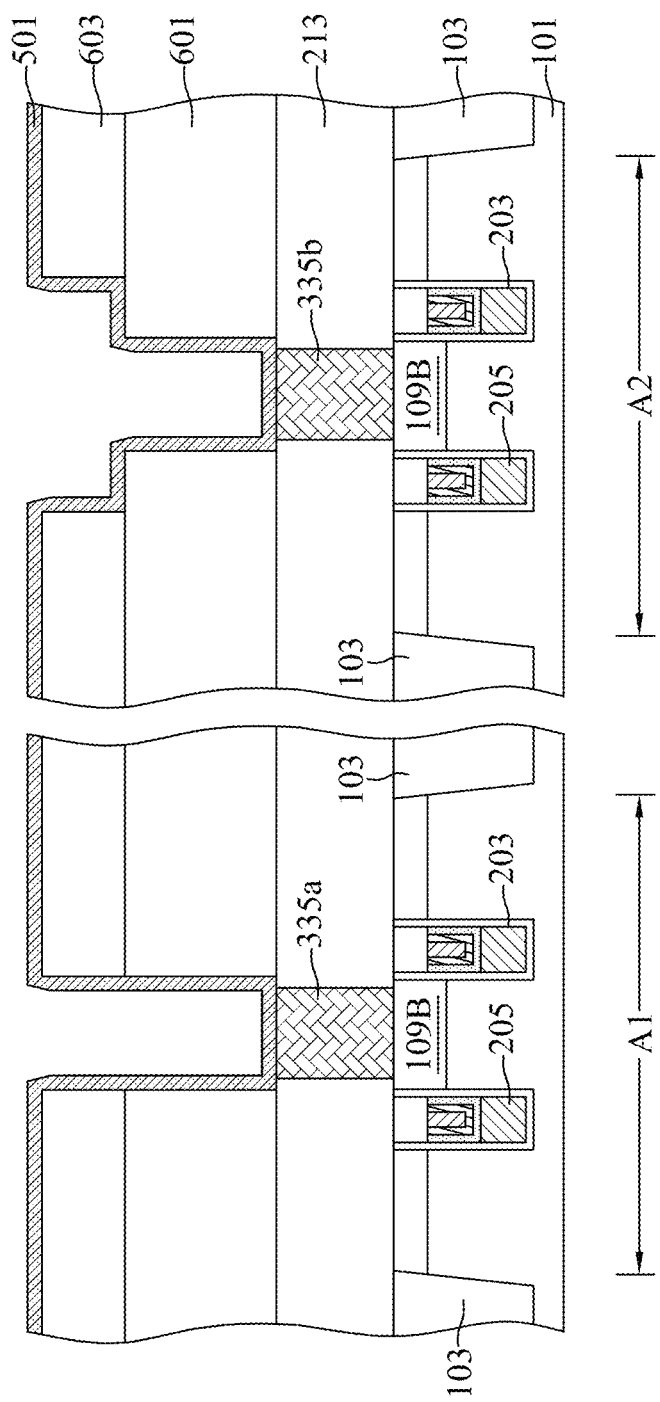
FIG. 15 is a cross-sectional view illustrating an intermediate stage of forming a dielectric layer during the formation of the semiconductor device structure along the sectional line I-I' in FIG. 14, in accordance with some embodiments.

With reference to FIG. 15, a first spacer layer 501 may be formed to cover top surfaces of the second insulating film 603, sidewalls of the upper high-level bit line contact opening 307, sidewalls and bottom of the lower high-level bit line contact opening 309, sidewalls and bottoms of the low-level bit line trench 405, and sidewalls and bottom of the low-level bit line contact opening 407. The first spacer layer 501 may be formed of doped oxide such as borosilica glass, phosphosilica glass, borophosphosilica glass, fluoride silicate glass, carbon doped silicon oxide, or the like. Alternatively, in another embodiment, the first spacer layer 501 may be formed of a thermal decomposable polymer or a thermal degradable polymer.

Figure 16:
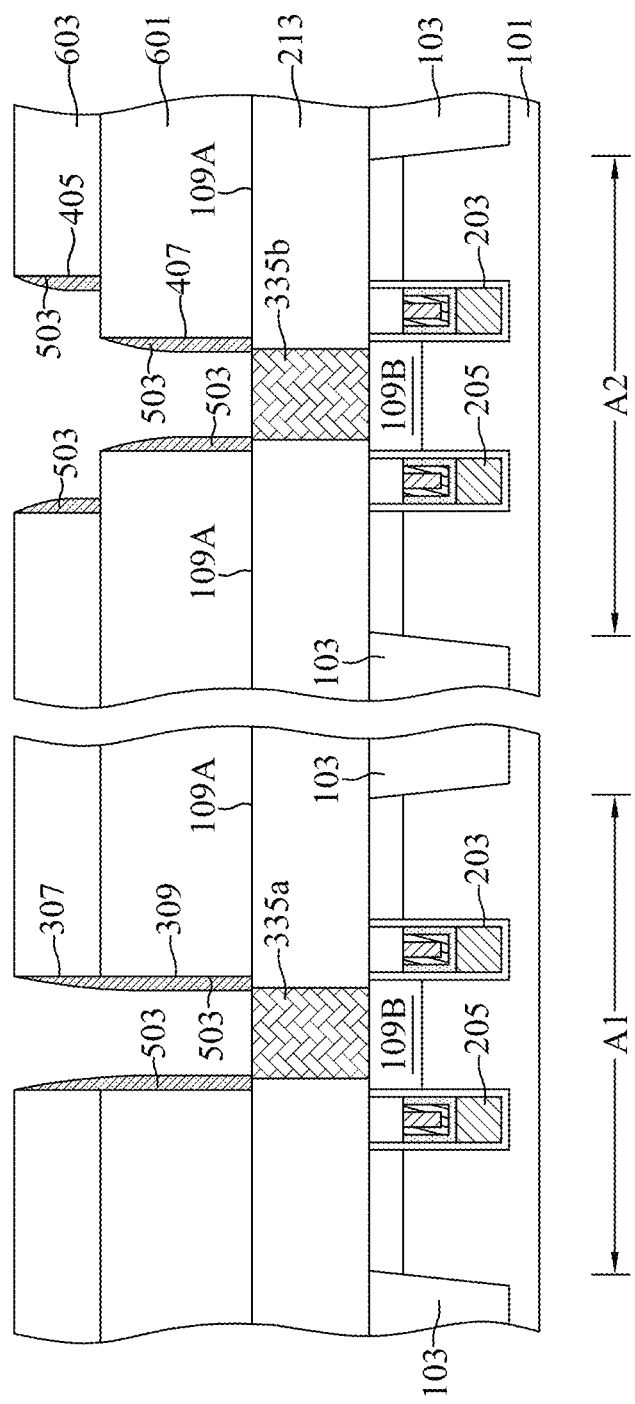
FIG. 16 is a top view illustrating an intermediate stage of forming air gap structures during the formation of the semiconductor device structure, in accordance with some embodiments.

With reference to FIG. 16, an etch process, such as an anisotropic dry etch process, may be performed to form a plurality of first spacers 503 attached to the sidewalls of the upper high-level bit line contact opening 307, the sidewalls of the lower high-level bit line contact opening 309, the sidewalls of the low-level bit line trench 405, and the sidewalls of the low-level bit line contact opening 407.

Figure 17:
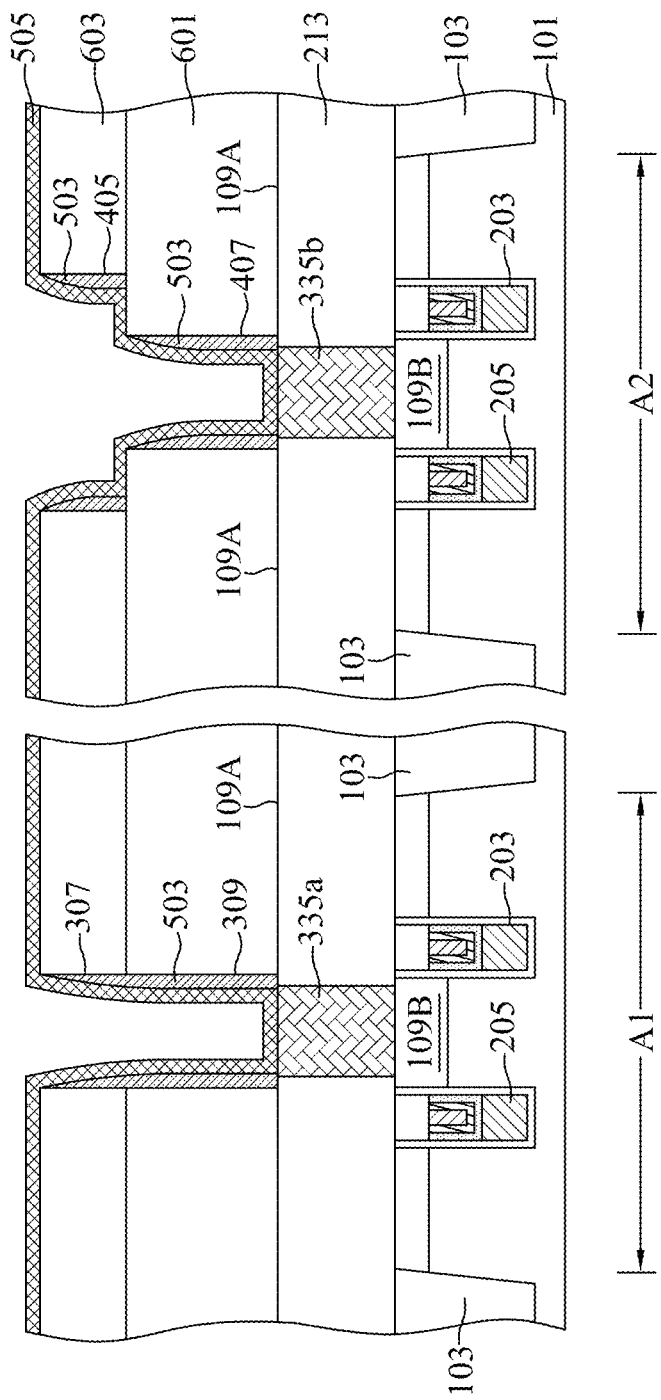
FIG. 17 is a cross-sectional view illustrating an intermediate stage of forming air gap structures during the formation of the semiconductor device structure along the sectional line I-I' in FIG. 16, in accordance with some embodiments.

With reference to FIG. 17, a second spacer layer 505 may be formed to cover the top surfaces of the second insulating film 603, the bottoms of the low-level bit line trench 405, the bottom of the low-level bit line contact opening 407, and surfaces of the plurality of first spacers 503. The second spacer layer 505 is different from the first spacer layer 501, and may be formed of, for example, silicon nitride.

Figure 18:
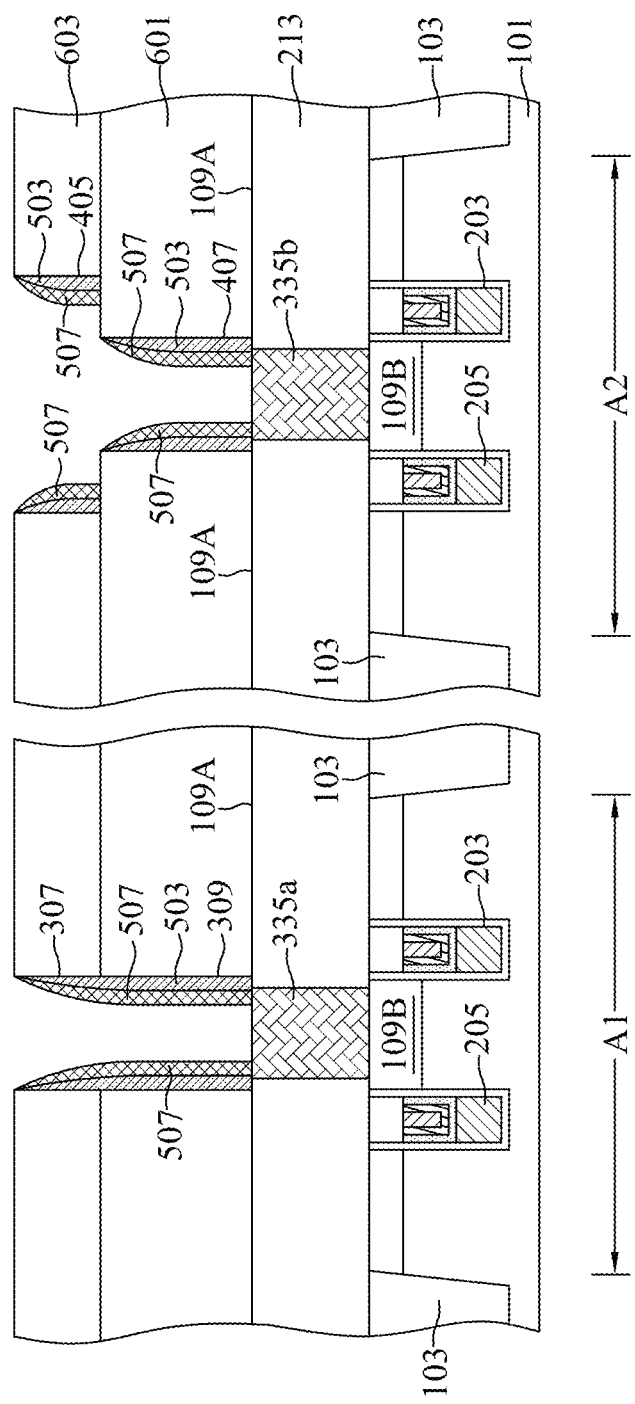
FIG. 18 is a top view illustrating an intermediate stage of forming an energy removable layer during the formation of a semiconductor device structure in a cell region and a semiconductor device structure in a peripheral region, in accordance with some embodiments.

With reference to FIG. 18, an etch process, such as an anisotropic dry etch process, may be performed to form a plurality of second spacers 507 attached to the surfaces of the plurality of first spacers 503.

Figure 19:
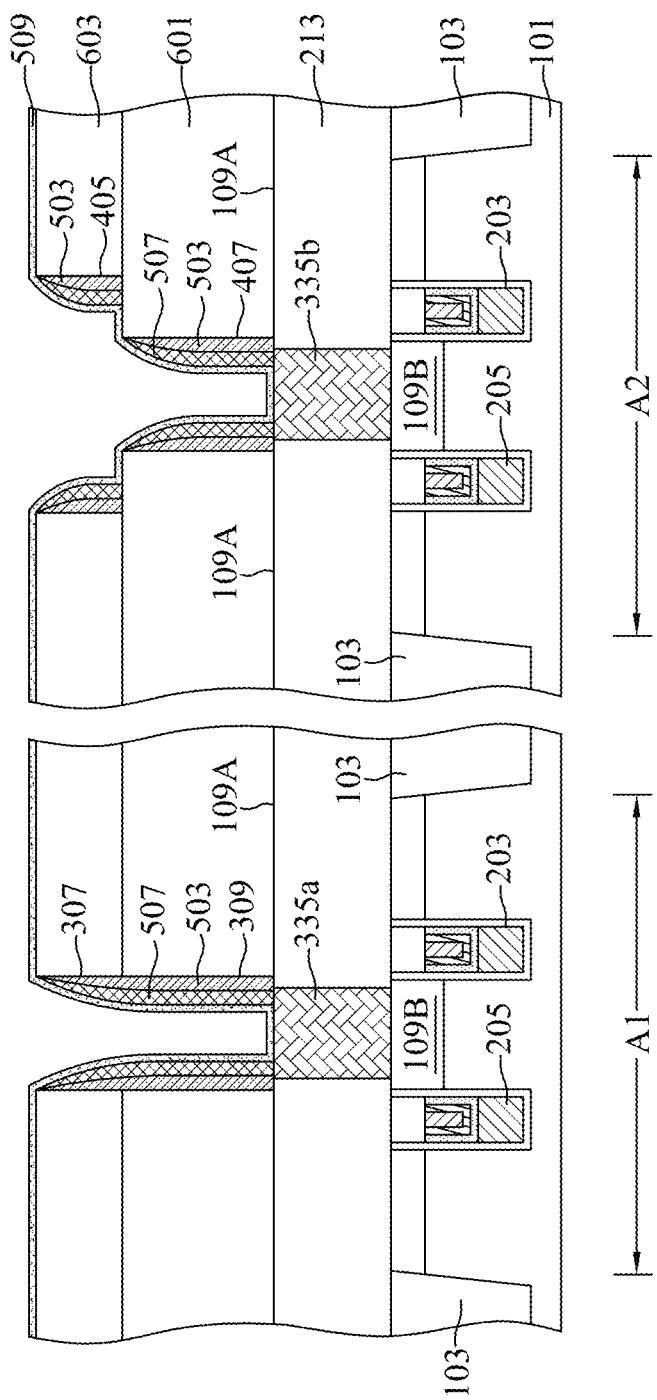
FIG. 19 is a cross-sectional view illustrating an intermediate stage of forming the energy removable layer during the formation of the semiconductor device structure in the cell region and the semiconductor device structure in the peripheral region along the sectional lines I-I' and II-IF in FIG. 18, in accordance with some embodiments.

With reference to FIG. 19, a liner layer 509 may be formed to cover the top surfaces of the second insulating film 603, surfaces of the plurality of second spacers 507, the bottoms of the low-level bit line trench 405, and the bottom of the low-level bit line contact opening 407. The liner layer 509 may be formed of, for example, titanium, titanium nitride, titanium silicon nitride, tantalum, tantalum nitride, tantalum silicon nitride, or a combination thereof.

Figure 20:
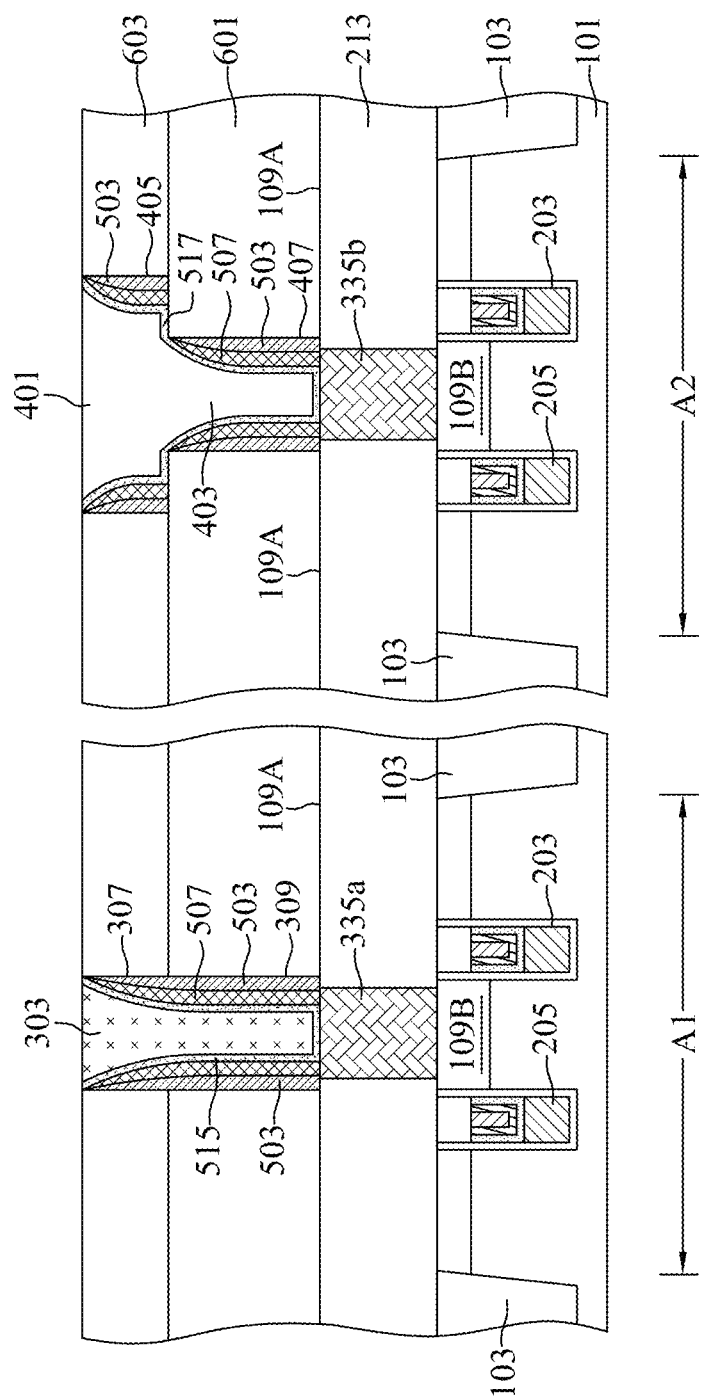
FIG. 20 is a cross-sectional view illustrating an intermediate stage of etching back the energy removable layer during the formation of the semiconductor device structure in the cell region and the semiconductor device structure in the peripheral region along the sectional lines I-I' and II-IF in FIG. 18, in accordance with some embodiments.

With reference to FIG. 20, a conductive material, for example, doped polysilicon, metal, metal nitride, or metal silicide, may be deposited into the upper high-level bit line contact opening 307, the lower high-level bit line contact opening 309, the low-level bit line trench 405, and the low-level bit line contact opening 407 by a metallization process. In the embodiment depicted, the conductive material may be tungsten. After the metallization process, a planarization process, such as chemical mechanical polishing, may be performed to remove excess filling material, provide a substantially flat surface for subsequent processing steps, and conformally form the high-level bit line contact 303, the low-level bit line contact 403, and the low-level bit line 401. In some embodiments, the low-level bit line contact 403, the low-level bit line 401, and the high-level bit line contact 303 are integrally formed by the same fabrication process, and may have similar physical properties such as hardness and chemical property such as etching rate.

Figure 21:
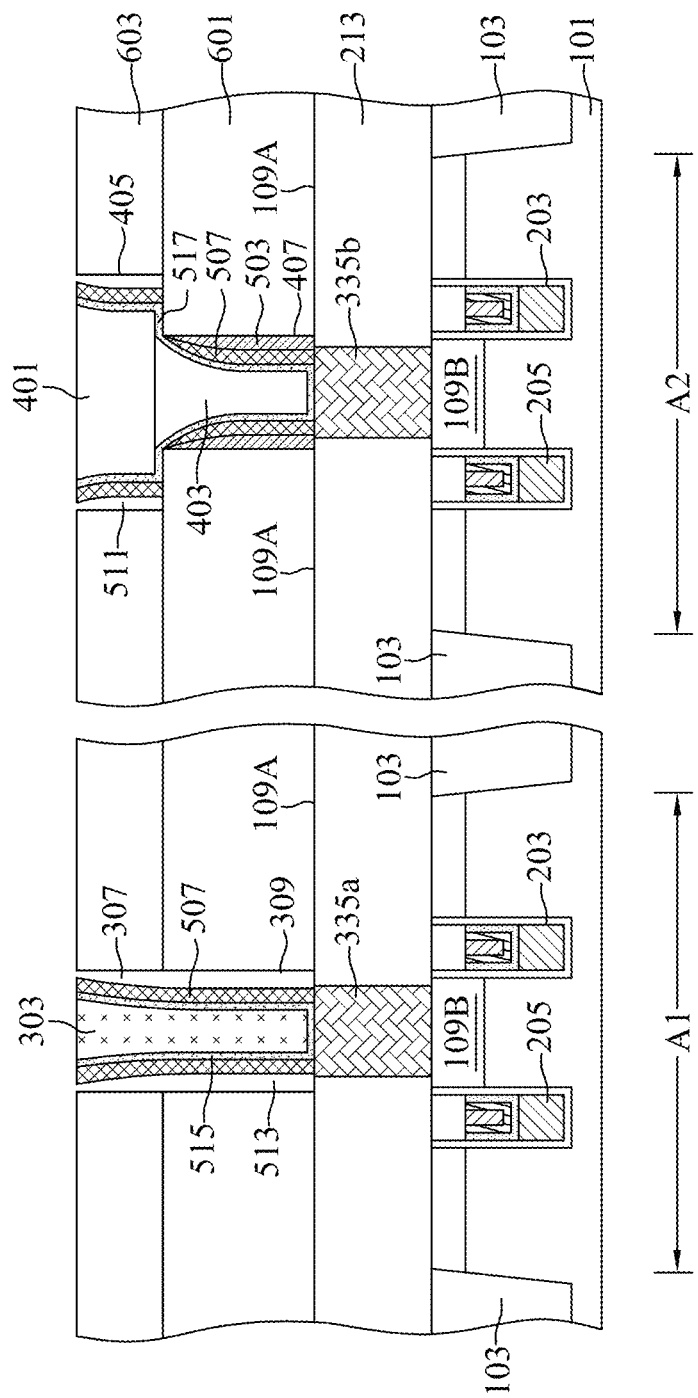
FIG. 21 is a cross-sectional view illustrating an intermediate stage of forming a dielectric layer during the formation of the semiconductor device structure in the cell region and the semiconductor device structure in the peripheral region along the sectional lines I-I' and II-IF in FIG. 18, in accordance with some embodiments.
Figure 22:
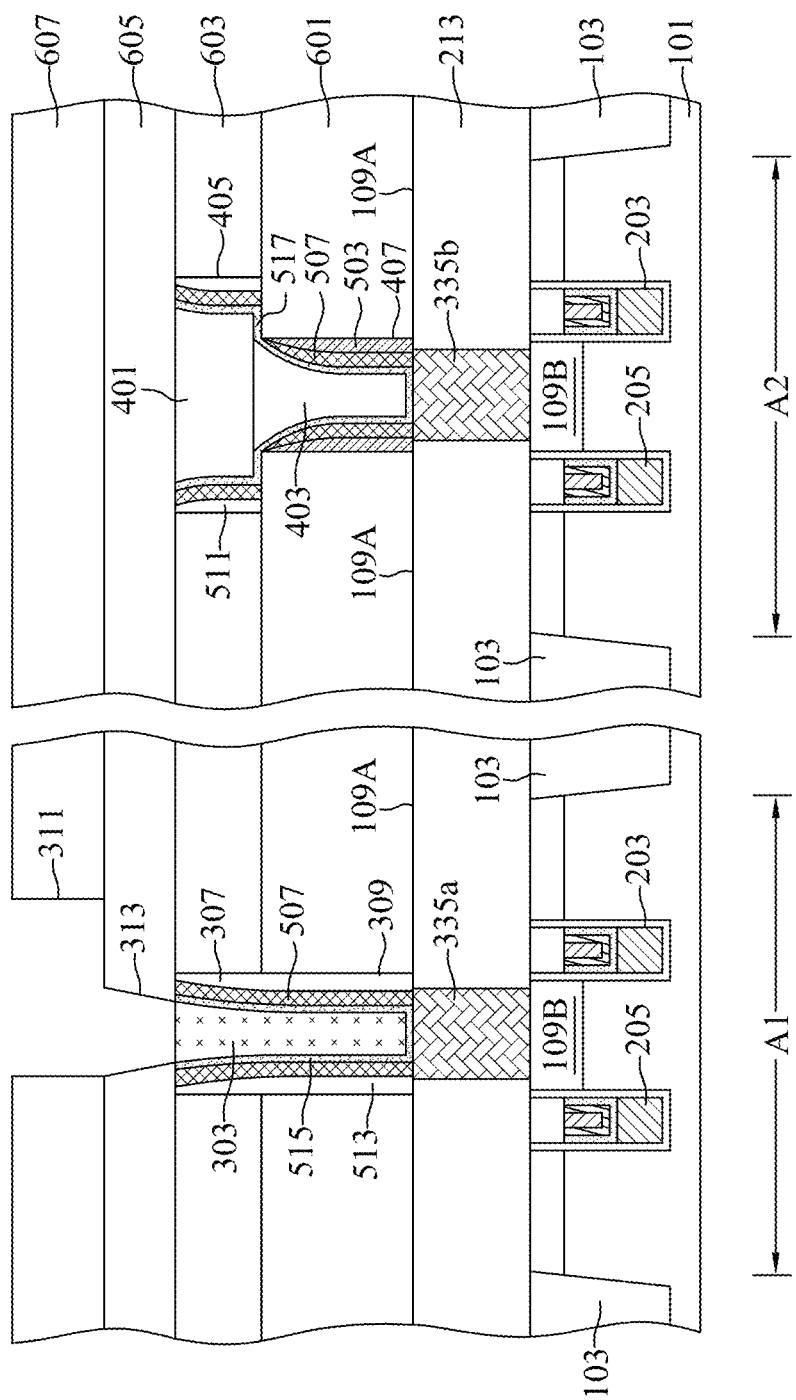
FIG. 22 is a cross-sectional view illustrating an intermediate stage of forming an air gap structure during the formation of the semiconductor device structure in the cell region and the semiconductor device structure in the peripheral region along the sectional lines I-I' and II-IF in FIG. 18, in accordance with some embodiments.

FIGS. 21-22 are cross-sectional views illustrating an intermediate stage of forming a plurality of air gaps above the substrate in accordance with some embodiments. With reference to FIG. 21, a planarization process, such as chemical mechanical polishing, may be performed to remove part of the liner layer 509. After the planarization process, the liner layer 509 may be turned into a first liner 515 disposed adjacent to sidewalls of the high-level bit line contact 303 and a second liner 517 disposed on and attached to the sidewalls of the low-level bit line 401, sidewalls of the low-level bit line contact 403, a bottom of the low-level bit line contact 403, and a portion of a top surface of the first insulating film 601. Top surfaces of the plurality of first spacers 503 disposed adjacent to the high-level bit line contact 303, and top surfaces of the plurality of first spacers 503 disposed adjacent to the low-level bit line 401 may be exposed after the planarization process.

Referring to FIG. 21, in some embodiments, the height of the low-level bit line contact 403 is less than the height of the high-level bit line contact 30. In some embodiments, the width of the low-level bit line 401 is greater than the width of the low-level bit line contact 403.

In some embodiments, the top surface of the high-level bit line contact 303 and the top surface of the low-level bit line 401 are substantially at the same level due to the planarization process, and the height of the high-level bit line contact 303 is substantially the same as a combined height of the low-level bit line contact 403 and the low-level bit line 401.

With reference to FIG. 22, the plurality of first spacers 503 disposed adjacent to the high-level bit line contact 303 and the plurality of first spacers 503 disposed adjacent to the low-level bit line 401 may be selectively removed to form the plurality of air gaps. In some embodiments, a vapor hydrogen fluoride may be introduced and may selectively etch the plurality of first spacers 503 of doped oxide disposed adjacent to the high-level bit line contact 303 and the plurality of first spacers 503 disposed adjacent to the low-level bit line 401. The vapor hydrogen fluoride has a higher etching rate on the plurality of first spacers 503 formed of doped oxide; therefore, the plurality of first spacers 503 disposed adjacent to the high-level bit line contact 303 and the plurality of first spacers 503 disposed adjacent to the low-level bit line 401 may be removed and the plurality of second spacers 507 formed of silicon nitride may be retained. The plurality of second spacers 507 may prevent the material of the high-level bit line contact 303, the low-level bit line 401, or the low-level bit line contact 403 from flowing into the plurality of air gaps during subsequent processing steps such as heat treatment. The plurality of air gaps may include first air gaps 511 and second air gaps 513. The first air gaps 511 may be disposed adjacent to the low-level bit line 401. The second air gaps 513 may be disposed adjacent to the high-level bit line contact 303.

In some embodiments, the air gap 513 and the air gap 511 are integrally formed by selectively etching the first spacers 503 of doped oxide. In some embodiments, the air gap 513 surrounds the high-level bit line contact 303 (cylinder or plug), with the first liner 515 and the second spacers 507 separating the high-level bit line contact 303 from the air gap 513; and, the air gap 511 is formed at two sides of the low-level bit line 401, with the second liner 517 and the second spacers 507 separating the low-level bit line 401 from the air gap 511. In some embodiments, the first spacers 503 at the sides of the low-level bit line contact 403 are not removed, and the air gap 511 is selectively formed at the sides of the low-level bit line 401, not at the sides of the low-level bit line contact 403.

With reference to FIG. 22, alternatively, in another embodiment, the plurality of first spacers 503 are formed of thermal decomposable polymer or thermal degradable polymer, and a thermal treating process is performed to remove the thermal decomposable polymer or thermal degradable polymer. A temperature of the heat process may be between about 300° C. and about 450° C. Preferably, the temperature of the heat process may be between about 350° C. and about 420° C.

With reference to FIG. 24, a high-level bit line contact and a high-level bit line are formed above the substrate in accordance with some embodiments. In some embodiments, a high-level bit line contact 305 and a high-level bit line 301 may be formed above the substrate 101. With reference to FIG. 24, a third insulating film 605 may be formed on the second insulating film 603 by, for example, spin-on-glass non-gap fills deposition. It should be noted that the first air gaps 511 and the second air gaps 513 may not be filled after the formation of the third insulating film 605. A fourth insulating film 607 may be formed on the third insulating film 605. A first photolithography process may be performed to define a position of the high-level bit line 301 on the fourth insulating film 607. After the first photolithography process, a first etch process, such as an anisotropic dry etch process, may be performed to form a high-level bit line trench 311 in the fourth insulating film 607. A second photolithography process may be performed to define positions of the high-level bit line contact 305 on the third insulating film 605.

Figure 23:
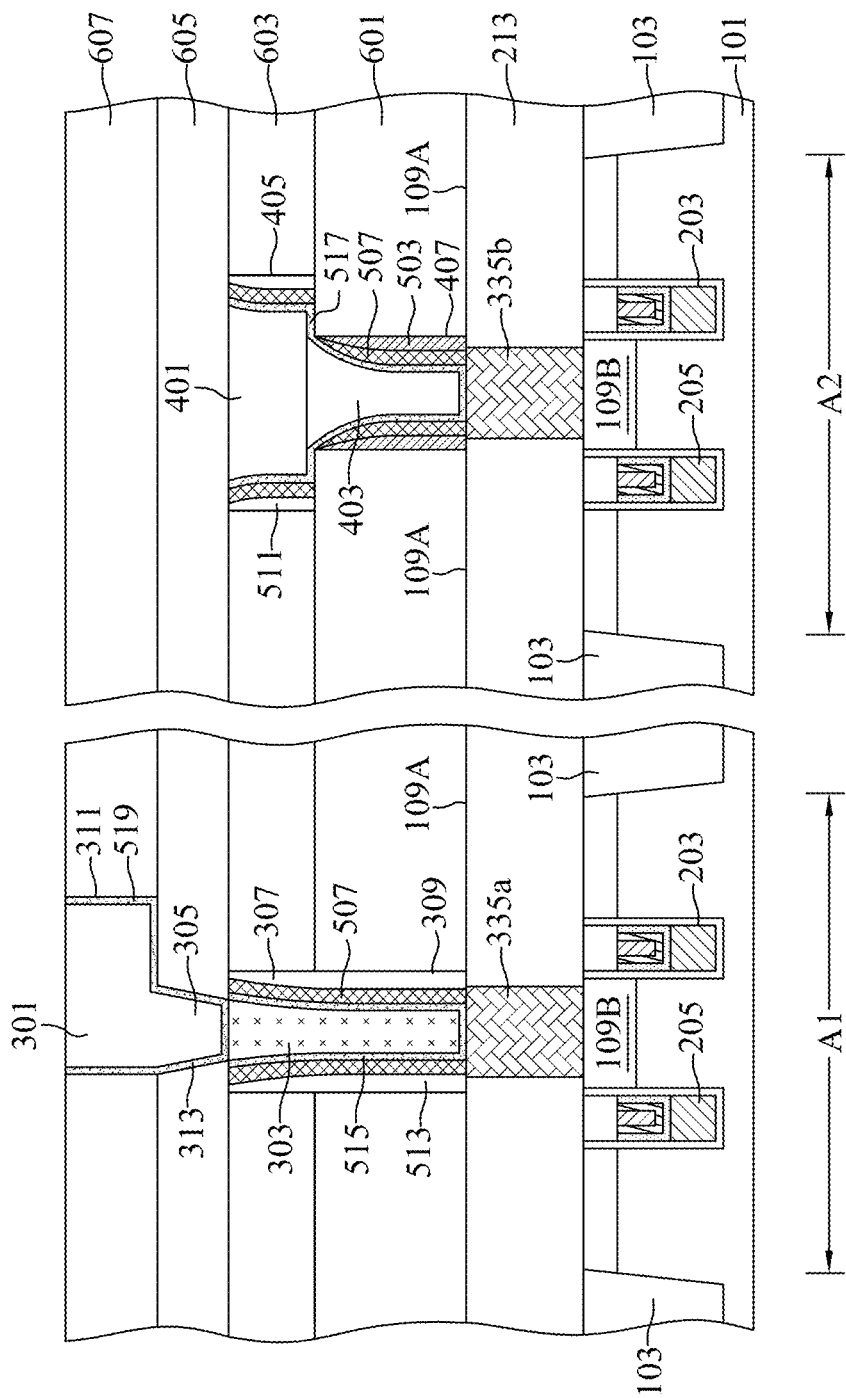
FIG. 23 is a partial schematic illustration of an exemplary integrated circuit, including an array of memory cells in accordance with some embodiments.

With reference to FIG. 23, a second etch process, such as an anisotropic dry etch process, may be performed after the second photolithography process to form a high-level bit line contact opening 313 in the third insulating film 605. A width of a bottom opening of the high-level bit line contact opening 313 may be less than a width of a top opening of the high-level bit line contact opening 313; in other words, a profile of the high-level bit line contact opening 313 may be tapered from top to bottom. That is to say, sidewalls of the high-level bit line contact opening 313 may be slanted toward each other. The width of the bottom opening of the high-level bit line contact opening 313 may be about the same as a width of a top surface of the high-level bit line contact 303. The top surface of the high-level bit line contact 303 may be exposed through the high-level bit line contact opening 313 and the high-level bit line trench 311. A cleaning process using a reducing agent may be optionally performed to remove the defects on the top surface of the high-level bit line contact 303 formed including tungsten. The reducing agent may be titanium tetrachloride, tantalum tetrachloride, or a combination thereof.

With reference to FIG. 23, a conductive material, for example, doped polysilicon, metal, metal nitride, or metal silicide, may be deposited into the high-level bit line trench 311 and the high-level bit line contact opening 313 by a metallization process. After the metallization process, a planarization process, such as chemical mechanical polishing, may be performed to remove excess filling material, provide a substantially flat surface for subsequent processing steps, and conformally form the high-level bit line 301 and the high-level bit line contact 305. In addition, a third liner 519 may be formed on and attached to sidewalls of the high-level bit line trench 311, a portion of a bottom of the high-level bit line trench 311, the sidewalls of the high-level bit line contact opening 313, and the bottom of the high-level bit line contact opening 313 before forming the high-level bit line 301 and the high-level bit line contact 305.

Referring to FIG. 23, in some embodiments, the width of the high-level bit line 301 is greater than the width of the high-level bit line contact 305 and the high-level bit line contact 303. In some embodiments, the high-level bit line 301 is asymmetrically positioned on the high-level bit line contact 305 and the high-level bit line contact 303.

In one embodiment of the present disclosure, a semiconductor device structure is provided. The semiconductor device structure comprises: a semiconductor substrate having a pattern-dense region and a pattern-loose region; an isolation member defining a first active area and a second doped region in the pattern-dense region; a first doped region and a second doped region positioned in the first active area and the second active area; a first metal plug disposed on the first doped region and a second metal plug disposed on the first doped region in the second active area; a third metal plug and a fourth metal plug disposed over a pattern-loose region of the semiconductor substrate; and a dielectric layer disposed over the pattern-dense region and the pattern-loose region of the semiconductor substrate, wherein a first portion of the dielectric layer between the first metal plug and the second metal plug is separated from the semiconductor substrate by a first air gap, and a second portion of the dielectric layer between the third metal plug and the fourth metal plug is in direct contact with the semiconductor substrate.

In one embodiment of the present disclosure, a method for forming a semiconductor device structure, comprising: forming a first metal plug, a second metal plug, a third metal plug, and a fourth metal plug over a semiconductor substrate, wherein the first metal plug and the second metal plug are formed over a pattern-dense region of the semiconductor substrate, and the third metal plug and the fourth metal plug are over a pattern-loose region of the semiconductor substrate; forming an energy removable liner covering the first metal plug, the second metal plug, the third metal plug, and the fourth metal plug; performing an etching process to remove a portion of the energy removable layer from the substrate, while remaining an energy removable block between the first metal plug and the second metal plug in the cell region; forming a dielectric layer covering the energy removable block and the first metal plug, the second metal plug, the third metal plug, and the fourth metal plug; performing a thermal treating process to transform the energy removable layer into an air gap structure including an air gap enclosed by liner layer; wherein a first portion of the dielectric layer extends between the first metal plug and the second metal plug such that the first portion of the dielectric layer and the semiconductor substrate are separated by the air gap while a second portion of the dielectric layer extends between the third metal plug and the fourth metal plug such that the second portion of the dielectric layer is in direct contact with the semiconductor substrate.

The embodiments of the present disclosure have some advantageous features. By forming air gap structures between the adjacent conductive metal plugs, the parasitic capacitance between the conductive contacts may be reduced. Moreover, since the air gap structures are separated from each other by a dielectric layer, the dielectric layer may provide additional structural support to the semiconductor device. These significantly improve the overall device performance and increase the yield rate.

Furthermore, the semiconductor memory device includes a plurality of air gaps, and the conductive features such as the high-level bit line and the low-level bit line are separated from the each other by the air gaps. Therefore, the parasitic capacitance between the conductive contacts may be reduced. As a result, the overall device performance may be improved (i.e., the decreased power consumption and resistive-capacitive (RC) delay), and the yield rate of the semiconductor device may be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:
a semiconductor substrate having a pattern-dense region and a pattern-loose region;
an isolation member defining a first active area and a second doped region in the pattern-dense region;
a first doped region and a second doped region positioned in the first active area and the second active area;
a first metal plug disposed on the first doped region and a second metal plug disposed on the first doped region in the second active area;
a third metal plug and a fourth metal plug disposed over a pattern-loose region of the semiconductor substrate; and
a dielectric layer disposed over the pattern-dense region and the pattern-loose region of the semiconductor substrate, wherein a first portion of the dielectric layer between the first metal plug and the second metal plug is separated from the semiconductor substrate by a first air gap, and a second portion of the dielectric layer between the third metal plug and the fourth metal plug is in direct contact with the semiconductor substrate.

2. The semiconductor device structure of claim 1, wherein a height of the second portion is greater than a height of the first portion.

3. The semiconductor device structure of claim 1, wherein the height of the second portion is substantially the same as a height of the third metal plug.

4. The semiconductor device structure of claim 1, wherein a width of the second portion of the dielectric layer is greater than a width of the first portion of the dielectric layer.

5. The semiconductor device structure of claim 1, wherein the first air gap is enclosed by a liner layer.

6. The semiconductor device structure of claim 1, wherein the first metal plug is separated from the second metal plug by a first distance, the third metal plug is separated from the fourth metal plug by a second distance, and the second distance is greater than the first distance.

7. The semiconductor device structure of claim 1, wherein the first metal plug, the second metal plug, the third metal plug, and the fourth metal plug are covered by the dielectric layer, and a top surface of the first metal plug is higher than a bottom surface of the first portion of the dielectric layer.

8. The semiconductor device structure of claim 1, further comprising:
a first word line buried in a first trench adjacent to the first doped region;
a high-level bit line contact positioned on the first doped region;
a second air gap surrounding the high-level bit line contact;
wherein the first word line comprises a lower electrode structure and an upper electrode structure on the lower electrode structure;
wherein the upper electrode structure comprises: a source layer substantially covering a sidewall of the first trench; a conductive layer disposed on the source layer; and a work-function adjustment layer disposed between the source layer and the conductive layer.

9. The semiconductor device structure of claim 8, further comprising:
a second word line buried in a second trench in the second active area of the semiconductor substrate, the second active area being separated from the first active area by the isolation member, and the second doped region being positioned adjacent to the second word line;
a low-level bit line positioned over the second doped region; and
a third second air gap positioned adjacent to the low-level bit line.

10. The semiconductor device structure of claim 9, further comprising:
a high-level bit line positioned on the high-level bit line contact; and
a low-level bit line contact positioned between the low-level bit line and the second doped region;
wherein a height of the low-level bit line contact is less than a height of the high-level bit line contact.

11. The semiconductor memory device of claim 10, wherein a width of the low-level bit line is greater than a width of the low-level bit line contact.

12. The semiconductor memory device of claim 10, wherein a width of the high-level bit line is greater than a width of the high-level bit line contact.

13. The semiconductor memory device of claim 10, wherein a height of the high-level bit line contact is substantially the same as a combined height of the low-level bit line contact and the low-level bit line.

14. The semiconductor memory device of claim 10, wherein a top surface of the high-level bit line contact and a top surface of the low-level bit line are substantially at the same level.

15. The semiconductor memory device of claim 10, wherein the high-level bit line is asymmetrically positioned on the high-level bit line contact.

16. The semiconductor memory device of claim 8, wherein a work function of the lower electrode structure is higher than a work function of the upper electrode structure.

17. The semiconductor memory device of claim 8, wherein the work-function adjustment layer conformally covers an inner sidewall of the source layer.

18. The semiconductor memory device of claim 8, wherein the source layer extends between the lower electrode structure and the conductive layer to cover a top surface of the lower electrode structure.

19. The semiconductor memory device of claim 8, wherein the work-function adjustment layer includes a metal or a metal nitride, and wherein the work-function adjustment element includes lanthanum (La).

20. A method for forming a semiconductor device structure, comprising:
forming a first metal plug, a second metal plug, a third metal plug, and a fourth metal plug over a semiconductor substrate, wherein the first metal plug and the second metal plug are formed over a pattern-dense region of the semiconductor substrate, and the third metal plug and the fourth metal plug are over a pattern-loose region of the semiconductor substrate;
forming an energy removable liner covering the first metal plug, the second metal plug, the third metal plug, and the fourth metal plug;
performing an etching process to remove a portion of the energy removable layer from the substrate, while remaining an energy removable block between the first metal plug and the second metal plug in the cell region;
forming a dielectric layer covering the energy removable block and the first metal plug, the second metal plug, the third metal plug, and the fourth metal plug;
performing a thermal treating process to transform the energy removable layer into an air gap structure including an air gap enclosed by liner layer;

wherein a first portion of the dielectric layer extends between the first metal plug and the second metal plug such that the first portion of the dielectric layer and the semiconductor substrate are separated by the air gap while a second portion of the dielectric layer extends between the third metal plug and the fourth metal plug such that the second portion of the dielectric layer is in direct contact with the semiconductor substrate.

* * * * *